(12) United States Patent
Balteanu et al.

(10) Patent No.: US 11,973,467 B2
(45) Date of Patent: *Apr. 30, 2024

(54) MULTI-LEVEL ENVELOPE TRACKING WITH ANALOG INTERFACE

(71) Applicant: Skyworks Solutions, Inc., Irvine, CA (US)

(72) Inventors: Florinel G. Balteanu, Irvine, CA (US); Serge Francois Drogi, Flagstaff, AZ (US); Shayan Farahvash, Kensington, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/300,726

(22) Filed: Apr. 14, 2023

(65) Prior Publication Data

US 2023/0291356 A1    Sep. 14, 2023

Related U.S. Application Data

(63) Continuation of application No. 17/456,955, filed on Nov. 30, 2021, now Pat. No. 11,658,615, which is a
(Continued)

(51) Int. Cl.
*H03F 1/30*      (2006.01)
*H03F 1/02*      (2006.01)
(Continued)

(52) U.S. Cl.
CPC ........... *H03F 1/0227* (2013.01); *H03F 3/195* (2013.01); *H03F 3/245* (2013.01);
(Continued)

(58) Field of Classification Search
CPC .................................. H03F 1/30; H03G 3/20
(Continued)

(56) References Cited

U.S. PATENT DOCUMENTS

| | | |
|---|---|---|
| 6,438,365 B1 | 8/2002 | Balteanu |
| 6,704,560 B1 | 3/2004 | Balteanu et al. |

(Continued)

FOREIGN PATENT DOCUMENTS

| | | |
|---|---|---|
| JP | 2012-004882 | 1/2012 |
| JP | 2013/005209 | 1/2013 |

(Continued)

OTHER PUBLICATIONS

International Search Report and Written Opinion for International Application No. PCT/US2020/052697 dated Jan. 12, 2021 in 9 pages.

(Continued)

*Primary Examiner* — Henry Choe
(74) *Attorney, Agent, or Firm* — Knobbe, Martens, Olson & Bear, LLP

(57) ABSTRACT

Multi-level envelope trackers with an analog interface are provided herein. In certain embodiments, an envelope tracking system for generating a power amplifier supply voltage for a power amplifier is provided. The envelope tracking system includes a multi-level supply (MLS) DC-to-DC converter that outputs multiple regulated voltages, and an MLS modulator that controls selection of the regulated voltages over time based on an analog envelope signal corresponding to an envelope of the RF signal amplified by the power amplifier.

20 Claims, 17 Drawing Sheets

Related U.S. Application Data continuation of application No. 16/948,543, filed on Sep. 23, 2020, now Pat. No. 11,223,324.

(60) Provisional application No. 62/906,940, filed on Sep. 27, 2019.

(51) Int. Cl.
  *H03F 3/195* (2006.01)
  *H03F 3/24* (2006.01)

(52) U.S. Cl.
  CPC .. *H03F 2200/102* (2013.01); *H03F 2200/168* (2013.01); *H03F 2200/336* (2013.01); *H03F 2200/451* (2013.01)

(58) Field of Classification Search
  USPC ........................................ 330/297, 129, 136
  See application file for complete search history.

(56) References Cited

U.S. PATENT DOCUMENTS

| | | | |
|---|---|---|---|
| 6,977,976 B1 | 12/2005 | Birkett et al. | |
| 7,496,339 B2 | 2/2009 | Balteanu et al. | |
| 8,140,028 B2 | 3/2012 | Balteanu et al. | |
| 8,351,873 B2 | 1/2013 | Balteanu et al. | |
| 8,718,188 B2 | 5/2014 | Balteanu et al. | |
| 8,786,371 B2 | 7/2014 | Popplewell et al. | |
| 8,981,847 B2 | 3/2015 | Balteanu | |
| 9,083,455 B2 | 7/2015 | Popplewell et al. | |
| 9,092,393 B2 | 7/2015 | Whitefield et al. | |
| 9,116,183 B2 | 8/2015 | Cummins et al. | |
| 9,118,277 B2 | 8/2015 | Balteanu et al. | |
| 9,143,096 B2 | 9/2015 | Balteanu et al. | |
| 9,189,430 B2 | 11/2015 | Ross et al. | |
| 9,197,128 B2 | 11/2015 | Popplewell et al. | |
| 9,225,308 B2 | 12/2015 | Langer et al. | |
| 9,288,098 B2 | 3/2016 | Yan et al. | |
| 9,294,054 B2 | 3/2016 | Balteanu et al. | |
| 9,391,648 B2 | 7/2016 | Popplewell et al. | |
| 9,425,833 B2 | 8/2016 | Popplewell et al. | |
| 9,445,371 B2 | 9/2016 | Khesbak et al. | |
| 9,559,637 B2 | 1/2017 | Yang et al. | |
| 9,584,070 B2 | 2/2017 | Balteanu et al. | |
| 9,588,529 B2 | 3/2017 | Balteanu et al. | |
| 9,606,947 B2 | 3/2017 | Ross et al. | |
| 9,668,215 B2 | 5/2017 | Balteanu et al. | |
| 9,673,707 B2 | 6/2017 | Popplewell et al. | |
| 9,698,832 B2 | 7/2017 | Popplewell et al. | |
| 9,774,300 B2 | 9/2017 | Jin et al. | |
| 9,806,676 B2 | 10/2017 | Balteanu et al. | |
| 9,831,834 B2 | 11/2017 | Balteanu et al. | |
| 9,876,473 B2 | 1/2018 | Khesbak et al. | |
| 9,893,682 B2 | 2/2018 | Zhu et al. | |
| 9,935,582 B2 | 4/2018 | Balteanu et al. | |
| 9,948,241 B2 | 4/2018 | Popplewell et al. | |
| 9,971,377 B2 | 5/2018 | Balteanu et al. | |
| 9,973,088 B2 | 5/2018 | Balteanu et al. | |
| 9,990,322 B2 | 6/2018 | Whitefield et al. | |
| 9,991,856 B2 | 6/2018 | Khesbak et al. | |
| 10,644,651 B1 | 5/2020 | Kim et al. | |
| 11,223,324 B2 | 1/2022 | Balteanu et al. | |
| 11,658,615 B2 | 5/2023 | Balteanu et al. | |
| 2003/0146791 A1 | 8/2003 | Shvarts et al. | |
| 2013/0207731 A1* | 8/2013 | Balteanu .................. | H03F 3/211 330/296 |
| 2015/0054588 A1 | 2/2015 | Wimpenny | |
| 2015/0194988 A1 | 7/2015 | Yan et al. | |
| 2016/0094186 A1 | 3/2016 | Cohen | |
| 2017/0005619 A1 | 1/2017 | Khlat | |
| 2017/0131734 A1 | 5/2017 | Balteanu et al. | |
| 2017/0195972 A1 | 7/2017 | Drogi et al. | |
| 2017/0223632 A1 | 8/2017 | Balteanu et al. | |
| 2017/0228332 A1 | 8/2017 | Ross et al. | |
| 2017/0338773 A1 | 11/2017 | Balteanu et al. | |
| 2018/0076772 A1 | 3/2018 | Khesbak et al. | |
| 2018/0138862 A1 | 5/2018 | Balteanu et al. | |
| 2018/0152144 A1 | 5/2018 | Choo et al. | |
| 2018/0152945 A1 | 5/2018 | Balteanu | |
| 2018/0159476 A1 | 6/2018 | Balteanu et al. | |
| 2018/0159478 A1 | 6/2018 | Balteanu et al. | |
| 2018/0167037 A1 | 6/2018 | Zhu et al. | |
| 2018/0234095 A1 | 8/2018 | Balteanu et al. | |
| 2018/0278213 A1 | 9/2018 | Henzler et al. | |
| 2018/0278214 A1 | 9/2018 | Jin et al. | |
| 2018/0287573 A1 | 10/2018 | Khesbak et al. | |
| 2018/0294776 A1 | 10/2018 | Popplewell et al. | |
| 2018/0302036 A1 | 10/2018 | Balteanu et al. | |
| 2018/0331659 A1 | 11/2018 | Khesbak et al. | |
| 2018/0351454 A1 | 12/2018 | Khesbak et al. | |
| 2018/0375476 A1 | 12/2018 | Balteanu et al. | |
| 2018/0375483 A1 | 12/2018 | Balteanu et al. | |
| 2019/0020315 A1 | 1/2019 | Khesbak et al. | |
| 2019/0068122 A1 | 2/2019 | Ha et al. | |
| 2019/0123690 A1 | 4/2019 | Balteanu et al. | |
| 2019/0140597 A1* | 5/2019 | Lin ...................... | H03F 1/0227 |
| 2019/0158046 A1 | 5/2019 | Lehtola et al. | |
| 2019/0165736 A1 | 5/2019 | Khesbak et al. | |
| 2019/0190462 A1 | 6/2019 | Zhu et al. | |
| 2019/0229621 A1 | 7/2019 | Balteanu et al. | |
| 2019/0341888 A1 | 11/2019 | Drogi et al. | |
| 2019/0372526 A1 | 12/2019 | Balteanu et al. | |
| 2019/0372628 A1 | 12/2019 | Balteanu et al. | |
| 2019/0386617 A1 | 12/2019 | Naraine et al. | |
| 2020/0067406 A1 | 2/2020 | Khesbak et al. | |
| 2020/0099343 A1 | 3/2020 | Khesbak et al. | |
| 2020/0112300 A1 | 4/2020 | Balteanu et al. | |
| 2020/0127619 A1 | 4/2020 | Khesbak et al. | |
| 2020/0154434 A1 | 5/2020 | Balteanu | |
| 2020/0162028 A1 | 5/2020 | Balteanu et al. | |
| 2020/0162030 A1 | 5/2020 | Drogi et al. | |
| 2020/0259458 A1 | 8/2020 | Balteanu et al. | |
| 2020/0259459 A1 | 8/2020 | Balteanu et al. | |
| 2020/0336110 A1 | 10/2020 | Drogi et al. | |
| 2020/0336122 A1 | 10/2020 | Lin et al. | |
| 2020/0343865 A1 | 10/2020 | Balteanu et al. | |
| 2021/0257971 A1* | 8/2021 | Kim ...................... | H03F 3/245 |
| 2022/0014152 A1* | 1/2022 | Gebeyehu ............... | H03F 3/245 |
| 2022/0224364 A1 | 7/2022 | Kim et al. | |

FOREIGN PATENT DOCUMENTS

| | | |
|---|---|---|
| JP | 2013-511242 | 3/2013 |
| JP | 2015-533066 | 11/2015 |
| JP | 2016-149743 | 8/2016 |
| WO | WO 2021/062141 | 4/2021 |

OTHER PUBLICATIONS

International Preliminary Report on Patentability and Written Opinion for International Application No. PCT/US2020/052697 dated Mar. 22, 2022, in 7 pages.

MIPI Alliance Application Note for Analog Reference Interface for Envelope Tracking (eTrackSM) v1.0, dated Dec. 16, 2013 in 80 pages.

\* cited by examiner

MULTI-LEVEL ENVELOPE TRACKING WITH ANALOG INTERFACE

CROSS-REFERENCE TO RELATED APPLICATIONS

This application is a continuation of U.S. patent application Ser. No. 17/456,955, filed Nov. 30, 2021, titled "MULTI-LEVEL ENVELOPE TRACKING WITH ANALOG INTERFACE," which is a continuation of U.S. patent application Ser. No. 16/948,543, filed Sep. 23, 2020, titled "MULTI-LEVEL ENVELOPE TRACKING WITH ANALOG INTERFACE," which claims the benefit of priority under 35 U.S.C. § 119 of U.S. Provisional Patent Application No. 62/906,940, filed Sep. 27, 2019 and titled "MULTI-LEVEL ENVELOPE TRACKING WITH ANALOG INTERFACE," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for Fifth Generation (5G) cellular communications in Frequency Range 1 (FR1).

SUMMARY

In certain embodiments, the present disclosure relates to an envelope tracking system. The envelope tracking system includes a power amplifier configured to amplify a radio frequency signal and to receive power from a power amplifier supply voltage, and an envelope tracker configured to generate the power amplifier supply voltage based on an analog envelope signal corresponding to an envelope of the radio frequency signal. The envelope tracker includes a DC-to-DC converter configured to output a plurality of regulated voltages, a modulator configured to generate a modulator output voltage at an output based on the plurality of regulated voltages and the analog envelope signal, and a modulator output filter coupled between the output of the modulator and the power amplifier supply voltage, the modulator configured to generate the modulator output voltage based on comparing the analog envelope signal to a plurality of signal thresholds.

In some embodiments, the modulator includes a plurality of switches selectively activated based on comparing the analog envelope signal to the plurality of signal thresholds. According to a number of embodiments, each of the plurality of switches is connected between the output of the modulator and a corresponding one of the plurality of regulated voltages.

In various embodiments, the envelope tracker further includes a plurality of modulators including the modulator and a plurality of modulator output filters including the modulator output filter, each of the plurality of modulators coupled to the power amplifier supply voltage by way of a corresponding one of the plurality of modulator output filters. According to a number of embodiments, an active number of the plurality of modulators is selected based on comparing the analog envelope signal to the plurality of signal thresholds.

In several embodiments, the modulator is configured to receive the analog envelope signal over a Mobile Industry Peripheral Interface Analog Reference Interface for Envelope Tracking.

In some embodiments, the analog envelope signal is a differential envelope signal. According to a number of embodiments, the modulator includes a differential envelope amplifier configured to amplify the differential envelope signal to generate a single-ended envelope signal. In accordance with various embodiments, the modulator further includes a plurality of comparators each configured to compare the single-ended envelope signal to a corresponding one of the plurality of signal thresholds. According to several embodiments, the differential envelope amplifier includes an amplification circuit configured to amplify the differential envelope signal, and a common mode feedback circuit operable to compensate the amplification circuit for a common mode error arising from a common mode voltage of the differential envelope signal. In accordance with a number of embodiments, the amplification circuit includes a first differential input configured to receive the differential envelope signal and a second differential input configured to receive a differential compensation signal from the common mode feedback circuit. According to various embodiments, the common mode feedback circuit is configured to provide feedback from an output of the amplification circuit to the second differential input of the amplification circuit. In accordance with several embodiments, the differential envelope amplifier further includes a differential input filter configured to filter the differential envelope signal prior to amplification by the amplification circuit.

In some embodiments, each of the plurality of signal thresholds is controllable.

In various embodiments, the envelope tracker further includes a DC path filter coupled between a DC voltage and the power amplifier supply voltage. According to a number of embodiments, the DC-to-DC converter is further configured to generate the DC voltage. In accordance with several embodiments, the DC-to-DC converter is configured to receive a battery voltage, and to generate the plurality of regulated voltages and the DC voltage based on providing DC-to-DC conversion of the battery voltage. According to a number of embodiments, the DC path filter includes at least one series inductor and at least one shunt capacitor. In accordance with some embodiments, a DC path through the DC path filter carries at least seventy five percent of the energy provided from the envelope tracker to the power amplifier.

In several embodiments, each of the plurality of regulated voltages has a different voltage level.

In some embodiments, the envelope tracker further includes a plurality of decoupling capacitors each coupled between ground and a corresponding one of the plurality of regulated voltages.

In various embodiments, the modulator output filter includes at least one series inductor and at least one shunt capacitor. According to a number of embodiments, the modulator output filter further includes a DC blocking capacitor in series between the modulator output voltage and the power amplifier supply voltage.

In certain embodiments, the present disclosure relates to an envelope tracker. The envelope tracker includes a power amplifier supply voltage terminal configured to output a power amplifier supply voltage for a power amplifier, a DC-to-DC converter configured to output a plurality of regulated voltages based on regulating a battery voltage, a modulator output filter, and a modulator including an output coupled to the power amplifier supply voltage terminal through the modulator output filter. The modulator is configured to generate a modulator output voltage at the output based on the plurality of regulated voltages and an analog envelope signal, and to generate the modulator output voltage based on comparing the analog envelope signal to a plurality of signal thresholds.

In some embodiments, the modulator includes a plurality of switches selectively activated based on comparing the analog envelope signal to the plurality of signal thresholds. According to various embodiments, each of the plurality of switches is connected between the output of the modulator and a corresponding one of the plurality of regulated voltages. In accordance with a number of embodiments, the envelope tracker further includes a plurality of modulators including the modulator and a plurality of modulator output filters including the modulator output filter, each of the plurality of modulators coupled to the power amplifier supply voltage terminal by way of a corresponding one of the plurality of modulator output filters. According to several embodiments, an active number of the plurality of modulators is selected based on comparing the analog envelope signal to the plurality of signal thresholds.

In various embodiments, the modulator is configured to receive the analog envelope signal over a Mobile Industry Peripheral Interface Analog Reference Interface for Envelope Tracking.

In some embodiments, the analog envelope signal is a differential envelope signal. According to several embodiments, the modulator includes a differential envelope amplifier configured to amplify the differential envelope signal to generate a single-ended envelope signal. In a number of embodiments, the modulator further includes a plurality of comparators each configured to compare the single-ended envelope signal to a corresponding one of the plurality of signal thresholds. According to various embodiments, the differential envelope amplifier includes an amplification circuit configured to amplify the differential envelope signal, and a common mode feedback circuit operable to compensate the amplification circuit for a common mode error arising from a common mode voltage of the differential envelope signal. In accordance with several embodiments, the amplification circuit includes a first differential input configured to receive the differential envelope signal and a second differential input configured to receive a differential compensation signal from the common mode feedback circuit. According to a number of embodiments, the common mode feedback circuit is configured to provide feedback from an output of the amplification circuit to the second differential input of the amplification circuit. In accordance with various embodiments, the differential envelope amplifier further includes a differential input filter configured to filter the differential envelope signal prior to amplification by the amplification circuit.

In several embodiments, each of the plurality of signal thresholds is controllable.

In some embodiments, the envelope tracker further includes a DC path filter coupled between a DC voltage and the power amplifier supply voltage terminal. According to a number of embodiments, the DC-to-DC converter is further configured to generate the DC voltage. In accordance with various embodiments, the DC-to-DC converter is configured to receive a battery voltage, and to generate the plurality of regulated voltages and the DC voltage based on providing DC-to-DC conversion of the battery voltage. According to several embodiments, the DC path filter includes at least one series inductor and at least one shunt capacitor. In accordance with a number of embodiments, a DC path through the DC path filter carries at least seventy five percent of the energy provided to the power amplifier supply voltage terminal.

In various embodiments, each of the plurality of regulated voltages has a different voltage level.

In several embodiments, the envelope tracker further includes a plurality of decoupling capacitors each coupled between ground and a corresponding one of the plurality of regulated voltages.

In some embodiments, the modulator output filter includes at least one series inductor and at least one shunt capacitor. According to a number of embodiments the modulator output filter further includes a DC blocking capacitor in series between the output of the modulator and the power amplifier supply voltage terminal.

In certain embodiments, the present disclosure relates to a mobile device. The mobile device includes a transceiver configured to generate a radio frequency transmit signal, a front end circuit including a power amplifier configured to amplify the radio frequency transmit signal and to receive power from a power amplifier supply voltage, and a power management circuit including an envelope tracker configured to generate the power amplifier supply voltage based on an analog envelope signal corresponding to an envelope of the radio frequency transmit signal. The envelope tracker includes a DC-to-DC converter configured to output a plurality of regulated voltages, a modulator configured to generate a modulator output voltage at an output based on the plurality of regulated voltages and the analog envelope signal, and a modulator output filter coupled between the output of the modulator and the power amplifier supply voltage. The modulator is configured to generate the modulator output voltage based on comparing the analog envelope signal to a plurality of signal thresholds.

In various embodiments, the modulator includes a plurality of switches selectively activated based on comparing the analog envelope signal to the plurality of signal thresholds. According to a number of embodiments, each of the plurality of switches is connected between the output of the modulator and a corresponding one of the plurality of regulated voltages.

In several embodiments, the envelope tracker further includes a plurality of modulators including the modulator and a plurality of modulator output filters including the modulator output filter, each of the plurality of modulators coupled to the power amplifier supply voltage by way of a corresponding one of the plurality of modulator output filters. According to a number of embodiments, an active number of the plurality of modulators is selected based on comparing the analog envelope signal to the plurality of signal thresholds.

In various embodiments, the modulator is configured to receive the analog envelope signal over a Mobile Industry Peripheral Interface Analog Reference Interface for Envelope Tracking.

In some embodiments, the analog envelope signal is a differential envelope signal. According to a number of embodiments, the modulator includes a differential envelope amplifier configured to amplify the differential envelope signal to generate a single-ended envelope signal. In accordance with several embodiments, the modulator further includes a plurality of comparators each configured to compare the single-ended envelope signal to a corresponding one of the plurality of signal thresholds. According to various embodiments, the differential envelope amplifier includes an amplification circuit configured to amplify the differential envelope signal, and a common mode feedback circuit operable to compensate the amplification circuit for a common mode error arising from a common mode voltage of the differential envelope signal. In accordance with a number of embodiments, the amplification circuit includes a first differential input configured to receive the differential envelope signal and a second differential input configured to receive a differential compensation signal from the common mode feedback circuit. According to various embodiments, the common mode feedback circuit is configured to provide feedback from an output of the amplification circuit to the second differential input of the amplification circuit. In accordance with several embodiments, the differential envelope amplifier further includes a differential input filter configured to filter the differential envelope signal prior to amplification by the amplification circuit.

In various embodiments, each of the plurality of signal thresholds is controllable.

In several embodiments, the envelope tracker further includes a DC path filter coupled between a DC voltage and the power amplifier supply voltage. According to a number of embodiments, the DC-to-DC converter is further configured to generate the DC voltage. In accordance with some embodiments, the mobile device further includes a battery that outputs a battery voltage, the DC-to-DC converter configured to generate the plurality of regulated voltages and the DC voltage based on providing DC-to-DC conversion of the battery voltage. According to various embodiments, the DC path filter includes at least one series inductor and at least one shunt capacitor. In accordance with a number of embodiments, a DC path through the DC path filter carries at least seventy five percent of the energy provided from the envelope tracker to the power amplifier.

In various embodiments, each of the plurality of regulated voltages has a different voltage level.

In some embodiments, the envelope tracker further includes a plurality of decoupling capacitors each coupled between ground and a corresponding one of the plurality of regulated voltages.

In several embodiments, the modulator output filter includes at least one series inductor and at least one shunt capacitor. According to a number of embodiments, the modulator output filter further includes a DC blocking capacitor in series between the modulator output voltage and the power amplifier supply voltage.

DETAILED DESCRIPTION OF EMBODIMENTS

Figure 1:
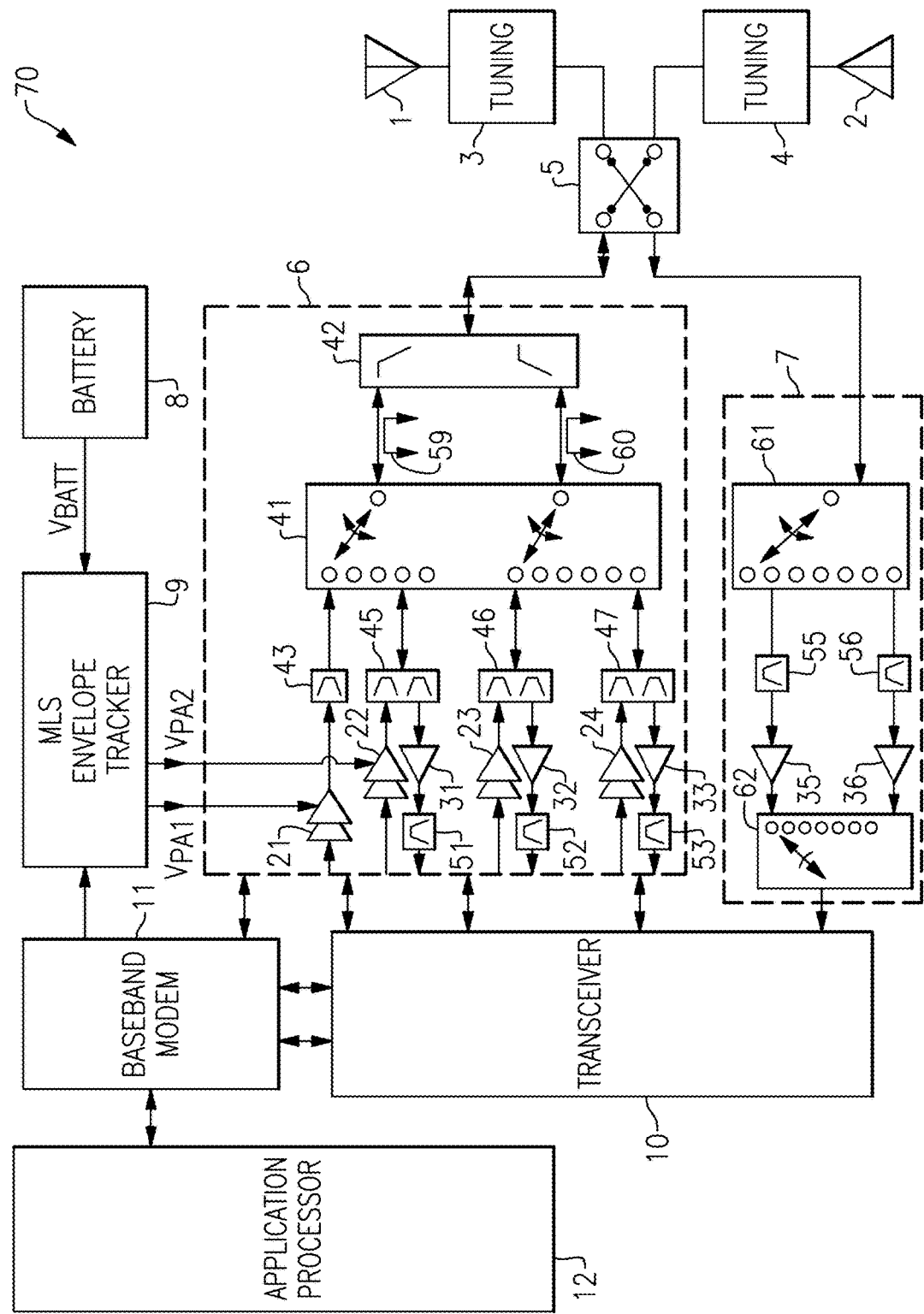
FIG. 1 is a schematic diagram of a mobile device according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Multi-level envelope trackers with an analog interface are provided herein. In certain embodiments, an envelope tracking system for generating a power amplifier supply voltage for a power amplifier is provided. The envelope tracking system includes a multi-level supply (MLS) DC-to-DC converter that outputs multiple regulated voltages, an MLS modulator that controls selection of the regulated voltages over time based on an analog envelope signal corresponding to an envelope of the RF signal amplified by the power amplifier, and a modulator output filter coupled between an output of the MLS modulator and the power amplifier supply voltage.

The MLS modulator processes the analog envelope signal to control modulation operations. For example, in certain implementations, the MLS modulator includes two or more comparators for comparing the signal level of the analog envelope signal to different threshold levels. Additionally, the output signals of the comparators are used to control selection of the modulator's switches to thereby control modulation.

In certain implementations, the analog envelope signal is received over a Mobile Industry Peripheral Interface (MIPI) Analog Reference Interface for Envelope Tracking (eTrak). Additionally, the MLS modulator processes the analog envelope signal to control operations of the MLS modulator. Thus, the teachings herein can be used to reuse a MIPI eTrak interface for multi-level envelope tracking.

To enhance granularity of control over modulation, in certain implementations the envelope tracking system includes two or more modulators and two or more corresponding modulator output filters that operate in parallel with one another to generate the power amplifier supply voltage based on the analog envelope signal and the regulated voltages. Including multiple modulators can provide a finer resolution of quantization. For example, any number of the modulators can be activated at a given time to provide greater control over the power amplifier supply voltage relative to an implementation with a single modulator and a single modulator output filter.

In certain implementations, the envelope tracking system further includes a DC path filter coupled between a DC voltage and the power amplifier supply voltage. By including a DC path through the DC path filter and a separate AC path through the modulator output filter, enhanced efficiency of the envelope tracking system can be achieved.

For example, low frequency current, such as DC current, can be provided through the DC path filter (for instance, via a filter inductor), thereby relaxing size and/or DC resistance constraints of the modulator's switches. Accordingly, lower switching losses in the AC path can be achieved, thereby enhancing overall system efficiency. In one example, the DC path carries at least 75% of the energy provided by envelope tracking system to the power amplifier.

In certain implementations, the DC voltage is a regulated voltage from a DC-to-DC converter. For example, the MLS DC-to-DC converter can also be used to generate the DC voltage. In such implementations, the voltage level of the DC voltage can be the same or different as the voltage level of one of the regulated voltages provided to the MLS modulator.

FIG. 1 is a schematic diagram of a mobile device 70 according to one embodiment. The mobile device 70 includes a primary antenna 1, a diversity antenna 2, a primary antenna tuning circuit 3, a diversity antenna tuning circuit 4, a double-pole double-throw (DPDT) antenna diversity switch 5, a primary front end module 6, a diversity front end module 7, a battery 8, an MLS envelope tracker 9, a transceiver 10, a baseband modem 11, and an application processor 12.

Although one embodiment of a mobile device is shown, the teachings herein are applicable to mobile devices implemented in a wide variety of ways. Accordingly, other implementations are possible.

In the illustrated embodiment, the primary front end module 6 includes a first power amplifier 21, a second power amplifier 22, a third power amplifier 23, a fourth power amplifier 24, a first low noise amplifier 31, a second low noise amplifier 32, a third low noise amplifier 33, a diplexer 42, a transmit/receive band switch 41, a transmit filter 43, a first duplexer 45, a second duplexer 46, a third duplexer 47, a first receive filter 51, a second receive filter 52, a third receive filter 53, a first directional coupler 59, and a second directional coupler 60. Additionally, the diversity front end module 7 includes a first low noise amplifier 35, a second low noise amplifier 36, a first receive filter 55, a second receive filter 56, a first receive band selection switch 61, and a second receive band selection switch 62.

Although one embodiment of front end circuitry is shown, other implementations of front end circuitry are possible. For instance, front end circuitry can include power amplifiers (PAs), low noise amplifiers (LNAs), filters, switches, phase shifters, duplexers, and/or other suitable circuitry for processing RF signals transmitted and/or received from one or more antennas. Example functionalities of a front end include but are not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Accordingly, other implementations of primary front end modules, diversity receive front end modules, antenna selection, and/or antenna tuning can be used.

As shown in FIG. 1, the MLS envelope tracker 9 is used to generate one or more power amplifier supply voltages for power amplifiers used in the mobile device 70 to amplify RF signals for wireless transmission. In the illustrated embodiment, the MLS envelope tracker 9 receives a battery voltage $V_{BATT}$ from the battery 8, and generates a first power amplifier supply voltage $V_{PA1}$ for the first power amplifier 21 and a second power amplifier supply voltage $V_{PA2}$ for the first power amplifier 22. Although an example in which the MLS envelope tracker 9 generates two power amplifier supply voltages is shown, the MLS envelope tracker 9 can generate more or fewer power amplifier supply voltages.

The MLS envelope tracker 9 controls the first power amplifier supply voltage $V_{PA1}$ to track an envelope of a first RF signal amplified by the first power amplifier 21. Additionally, the MLS envelope tracker 9 controls the second power amplifier supply voltage $V_{PA2}$ to track an envelope of a second RF signal amplified by the second power amplifier 22. In certain implementations, the MLS envelope tracker 9 receives digital data from the baseband modem 11. For example, the MLS envelope tracker 9 can receive digital data indicating an envelope of the first RF signal and an envelope of the second RF signal.

The battery 8 can be any suitable battery for use in the mobile device 70, including, for example, a lithium-ion battery. The battery voltage $V_{BATT}$ is regulated by a DC-to-DC converter of the MLS envelope tracker 9 to generate regulated voltages used for multi-level envelope tracking in accordance with the teachings herein.

The transceiver 10 generates RF signals for transmission and processes incoming RF signals received from the primary antenna 1 and the diversity antenna 2. It will be understood that various functionalities associated with the transmission and receiving of RF signals can be achieved by one or more components that are collectively represented in FIG. 1 as the transceiver 10. In one example, separate components (for instance, separate circuits or dies) can be provided for handling certain types of RF signals.

The baseband modem 11 provides the transceiver 10 with digital representations of transmit signals, which the transceiver 10 processes to generate RF signals for transmission. The baseband modem 11 also processes digital representations of received signals provided by the transceiver 10.

As shown in FIG. 1, the baseband modem 11 is coupled to the application processor 12, which serves to provide primary application processing in the mobile device 70. The application processor 12 can provide a wide variety of functions, such as providing system capabilities suitable for supporting applications, including, but not limited to, memory management, graphics processing, and/or multimedia decoding.

Although the mobile device 70 illustrates one example of an RF system including a multi-level envelope tracker, a wide variety of RF systems can include one or more multi-level envelope trackers implemented in accordance with the teachings herein.

FIGS. 2-5 depict schematic diagram of various embodiments of envelope tracking systems for a power amplifier. However, the teachings herein are applicable to envelope trackers implemented in a wide variety of ways. Accordingly, other implementations are possible.

Figure 2:
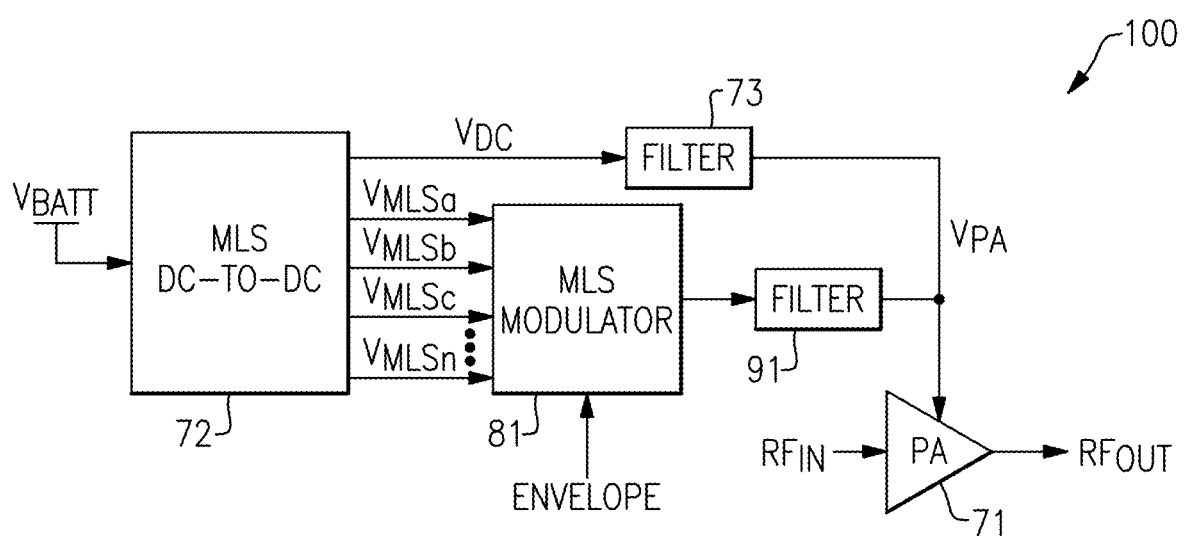
FIG. 2 is a schematic diagram of one embodiment of an envelope tracking system for a power amplifier.

FIG. 2 is a schematic diagram of one embodiment of an envelope tracking system 100 for a power amplifier 71. The envelope tracking system 100 includes an MLS DC-to-DC converter 72, a DC path filter 73, an MLS modulator 81, and a modulator output filter 91 that serves as an AC path filter, in this embodiment. The MLS DC-to-DC converter 72 is also referred to herein as a switching regulator.

The power amplifier 71 amplifies an RF input signal $RF_{IN}$ to generate an RF output signal $RF_{OUT}$. The MLS modulator 81 receives an analog envelope signal (ENVELOPE), which changes in relation to an envelope of the RF input signal $RF_{IN}$. In certain implementations, the analog envelope signal corresponds to an envelope signal received from a MIPI eTrak interface. However, other implementations are possible.

In the illustrated embodiment, the MLS DC-to-DC converter 72 receives a battery voltage $V_{BATT}$, and provides DC-to-DC conversion to generate a variety of regulated voltages $V_{MLSa}$, $V_{MLSb}$, $V_{MLSc}$ ... $V_{MLSn}$ of different voltage levels. Although an example in which four MLS voltages is depicted, the MLS DC-to-DC converter 72 can generate more or fewer MLS voltages as indicated by the ellipses. In this embodiment, the MLS DC-to-DC converter 72 also generates the DC voltage $V_{DC}$ by regulating the battery voltage $V_{BATT}$. The DC voltage $V_{DC}$ can be of the same or different voltage level as one of the regulated voltages $V_{MLSa}$, $V_{MLSb}$, $V_{MLSc}$ ... $V_{MLSn}$.

The MLS modulator 81 receives the regulated voltages $V_{MLSa}$, $V_{MLSb}$, $V_{MLSc}$ ... $V_{MLS}n$ and the analog envelope signal, and outputs a modulator output voltage to the modulator output filter 91. In certain implementations, the MLS modulator 81 controls the outputted voltage based on selecting a suitable regulated voltage over time based on the analog envelope signal. For example, the MLS modulator 81 can include a bank of switches for selectively connecting the regulated voltages $V_{MLSa}$, $V_{MLSb}$, $V_{MLSc}$ ... $V_{MLSn}$ to the modulator's output based on a signal level of the analog envelope signal.

In certain implementations, the MLS modulator 81 generates the modulator output voltage based on comparing the analog envelope signal to two or more signal thresholds. For example, the MLS modulator 81 can include two or more comparators that compare the analog envelope signal to different signal thresholds. Additionally, the MLS modulator 81 can include a plurality of switches each connected between the output of the MLS modulator 81 and a corresponding one of the regulated voltages, and the switches can be individually activated based on the comparisons.

The DC path filter 73 and the modulator output filter 91 filter the DC voltage $V_{DC}$ from the MLS DC-to-DC converter 72 and the output of MLS modulator 81, respectively, to thereby generate a power amplifier supply voltage $V_{PA}$ for the power amplifier 71.

By including a DC path through the DC path filter 73 and a separate AC path through the modulator output filter 91, enhanced efficiency of the envelope tracking system 100 can be achieved. For example, low frequency current (including, but not limited to, DC current) can be provided through the DC path filter 73, thereby relaxing size and/or DC resistance constraints of the MLS modulator's switches.

Accordingly, lower switching losses in the AC path can be achieved, thereby enhancing overall system efficiency. In one example, the DC path carries at least 75% of the energy provided by envelope tracking system 100 to the power amplifier 71.

Figure 3A:
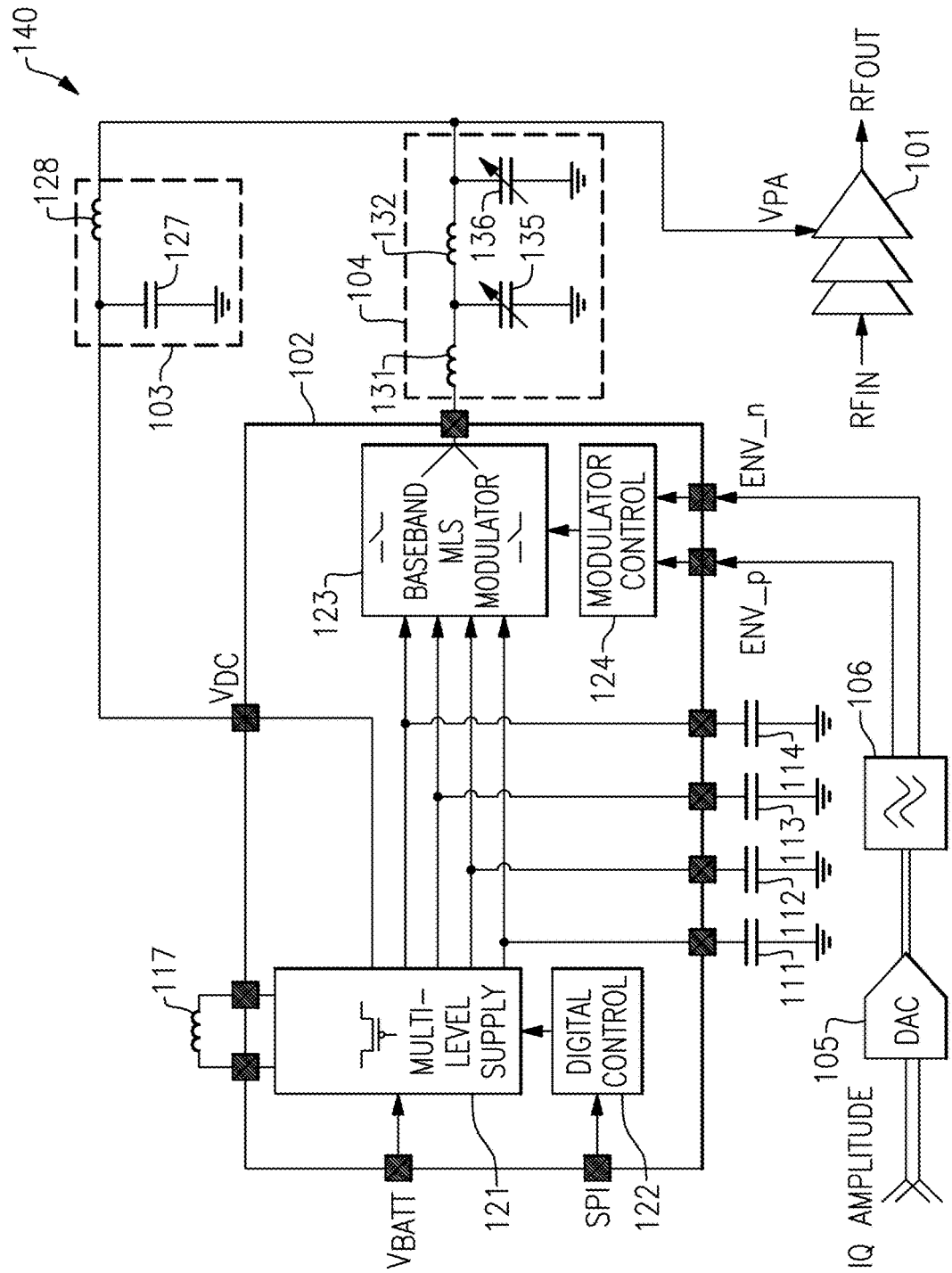
FIG. 3A is a schematic diagram of another embodiment of an envelope tracking system for a power amplifier.

FIG. 3A is a schematic diagram of another embodiment of an envelope tracking system 140 for a power amplifier 101. The envelope tracking system 140 includes an envelope tracking integrated circuit (IC) 102, a DC path filter 103, a modulator output filter 104 (which serves as an AC path filter, in this embodiment), DAC circuitry 105, an envelope filter 106, first to fourth decoupling capacitors 111-114, respectively, and an inductor 117.

Although one embodiment of an envelope tracking system is shown in FIG. 3A, the teachings herein are applicable to envelope tracking systems implemented in a wide variety of ways. Accordingly, other implementations are possible.

In the illustrated embodiment, the envelope tracking IC 102 includes MLS switching circuitry 121, a digital control circuit 122, a baseband MLS modulator 123, and a modulator control circuit 124. The envelope tracking IC 102 of FIG. 3A is depicted with various pins or pads for providing a variety of functions, such as receiving a battery voltage ($V_{BATT}$), communicating over a serial peripheral interface (SPI), outputting a DC voltage $V_{DC}$, receiving a differential analog envelope signal (ENV_p, ENV_n), connecting to the decoupling capacitors 111-114, and connecting to the inductor 117. An envelope tracking IC is also referred to herein in as an envelope tracking semiconductor die or chip.

The MLS switching circuitry 121 controls a current through the inductor 117 to provide voltage regulation. For example, the MLS switching circuitry 121 can include switches and a controller that turns on and off the switches using any suitable regulation scheme (including, but not limited to, pulse-width modulation) to provide DC-to-DC conversion. In the illustrated embodiment, the MLS switching circuitry 121 outputs four regulated MLS voltages of different voltage levels and a regulated DC voltage $V_{DC}$. However, the MLS switching circuitry 121 can be implemented to output more or fewer regulated voltages.

As shown in FIG. 3A, the MLS switching circuitry 121 is controlled by the digital control circuit 122. The digital control circuit 122 can provide programmability to the MLS switching circuitry 121 including, but not limited to, control over voltage levels of one or more regulated voltages outputted by the MLS switching circuitry 121. As shown in FIG. 3A, the digital control circuit 122 is coupled to the SPI bus. In certain implementations, the digital control circuit 122 controls the MLS switching circuitry 121 based on data received over the SPI bus and/or other chip interface.

The baseband MLS modulator 123 includes an output coupled to the power amplifier supply voltage $V_{PA}$ through the modulator output filter 104. In certain implementations, the baseband MLS modulator 123 includes switches coupled between each of the regulated MLS voltages and the modulator output filter 104. Additionally, the modulator's switches are selectively opened or closed by the modulator controller 124 based on the analog envelope signal.

In certain implementations, the modulator control circuit 124 includes a differential envelope amplifier for converting the differential analog envelope signal into a single-ended envelope signal, and two or more comparators that compare the single-ended analog envelope signal to different signal thresholds. Additionally, the modulator controller 124 controls the activation of the switches of the MLS modulator 123 based on the results of the comparisons.

In the illustrated embodiment, the DC path filter 103 includes a shunt capacitor 127 and a series inductor 128. Additionally, the modulator output filter 104 includes a first series inductor 131, a second series inductor 132, a first shunt capacitor 135, and a second shunt capacitor 136. Although example implementations of a DC path filter and a modulator output filter 104 are depicted in FIG. 3A, the teachings herein are applicable to filters implemented in a wide variety of ways. Accordingly, other implementations of filters can be used in accordance with the teachings herein.

In certain implementations, one or more components of a filter are controllable (for instance, digitally programmable and/or analog-tuned) to provide enhanced flexibility and/or configurability. For example, in the illustrated embodiment, the first shunt capacitor 135 and the second shunt capacitor 136 are controllable. Although two examples of controllable filter components are shown, other filter components can additionally or alternatively be implemented to be controllable.

Figure 3B:
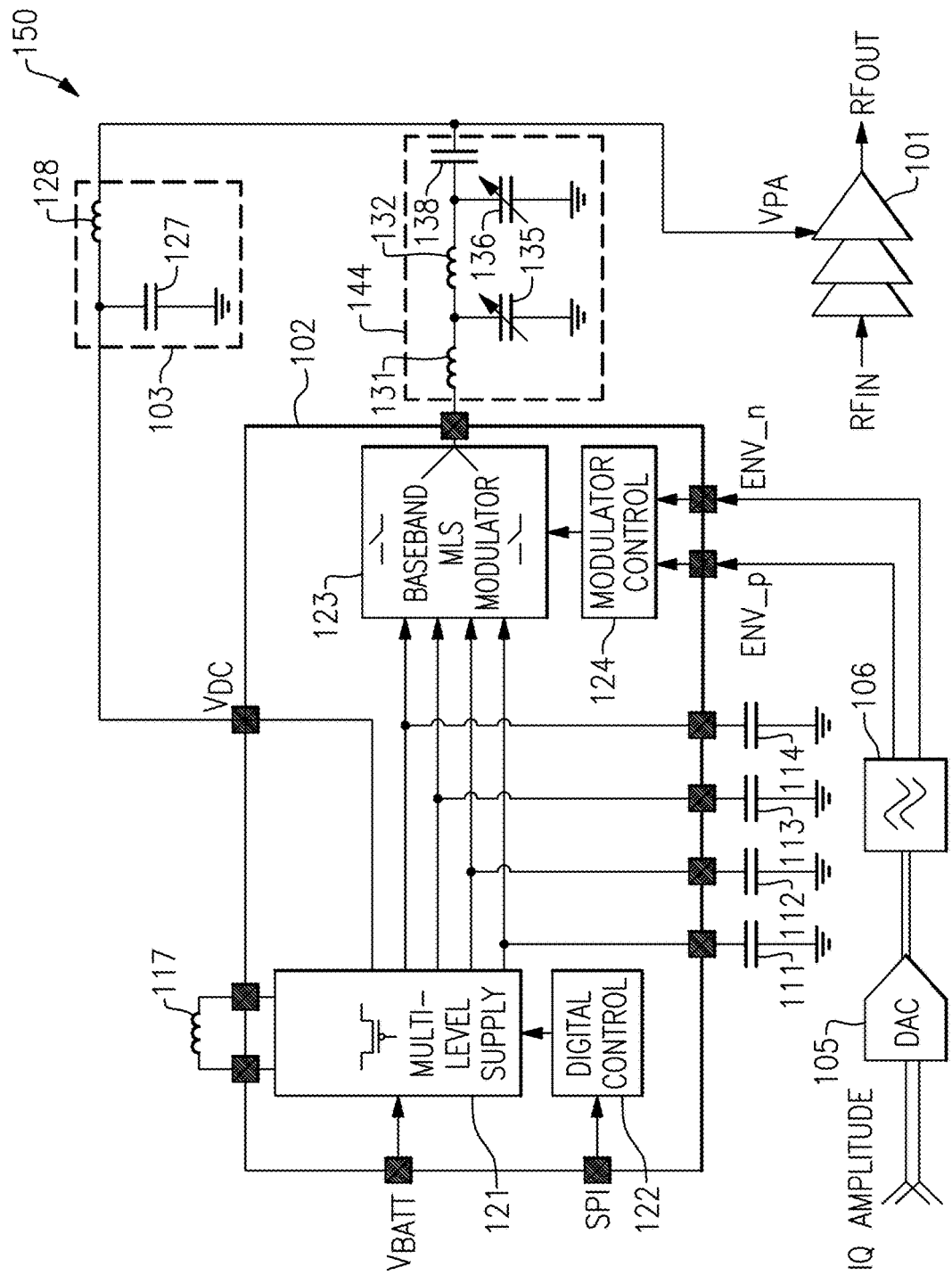
FIG. 3B is a schematic diagram of another embodiment of an envelope tracking system for a power amplifier.

FIG. 3B is a schematic diagram of another embodiment of an envelope tracking system 150 for a power amplifier 101. The envelope tracking system 150 of FIG. 3B is similar to the envelope tracking system 140 of FIG. 3A, except that the envelope tracking system 150 includes a different implementation of a modulator output filter 144.

For example, in comparison to the modulator output filter 104 of FIG. 3A, the modulator output filter 144 of FIG. 3B further includes a DC blocking capacitor 138 for blocking low frequency current through the modulator output filter 144. In the illustrated embodiment, the DC blocking capacitor 138 is coupled to the output of the modulator output filter 144.

By including the DC blocking capacitor 138, lower switching losses in the AC path can be achieved, thereby enhancing overall system efficiency. For example, inclusion of the DC blocking capacitor 138 can aid in increasing a percentage of energy carried by the DC path through the DC path filter 103 relative to the energy carried by the AC path through the modulator output filter 144. In one example, the DC path through the DC path filter 103 carries at least 75% of the energy provided by envelope tracking system 150 to the power amplifier 101.

Figure 3C:
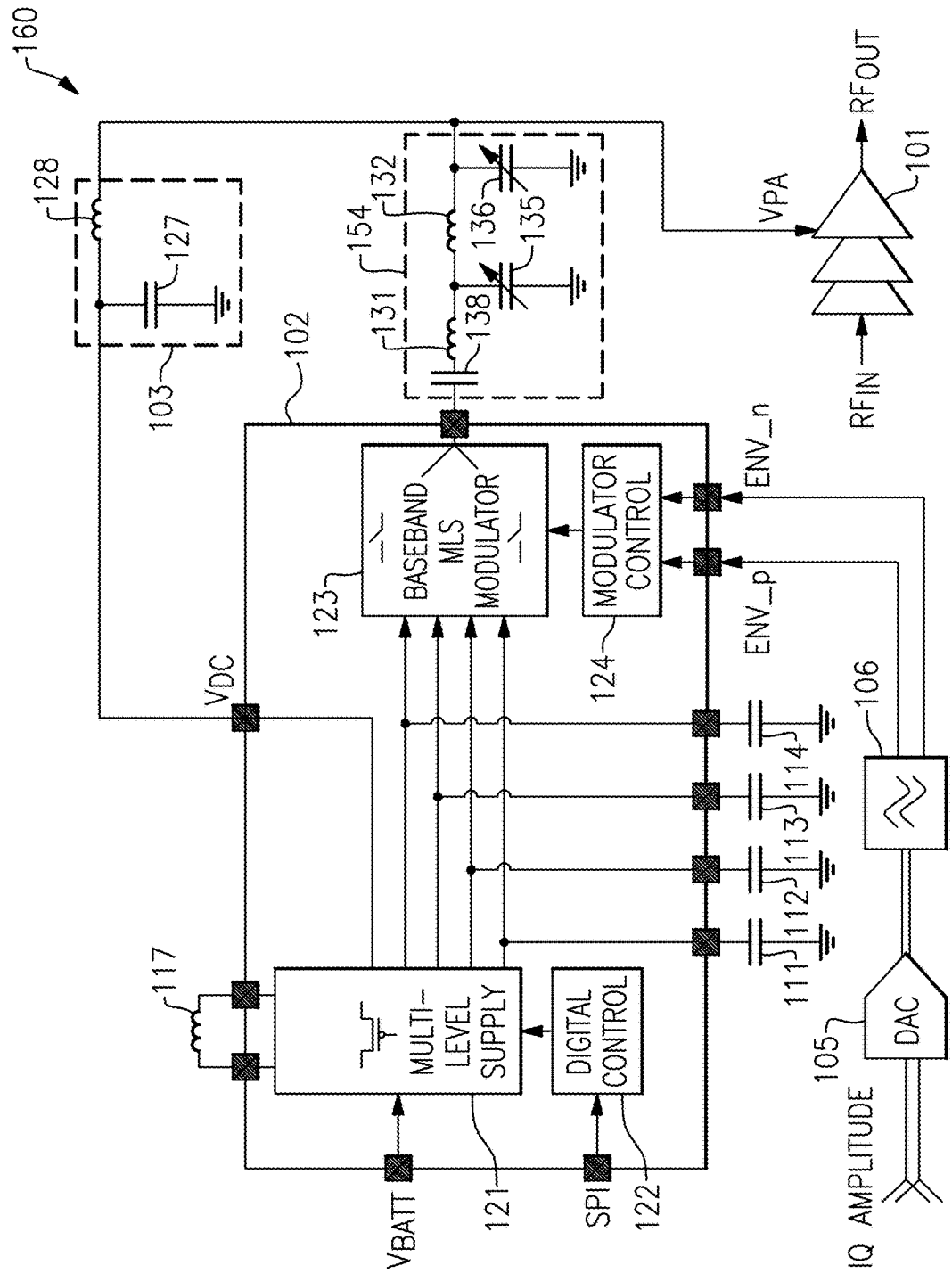
FIG. 3C is a schematic diagram of another embodiment of an envelope tracking system for a power amplifier.

FIG. 3C is a schematic diagram of another embodiment of an envelope tracking system 160 for a power amplifier 101. The envelope tracking system 160 of FIG. 3C is similar to the envelope tracking system 150 of FIG. 3B, except that the envelope tracking system 160 includes a different implementation of a modulator output filter 154.

For example, in comparison to the modulator output filter 144 of FIG. 3B, the modulator output filter 154 of FIG. 3C includes the DC blocking capacitor 138 coupled to the filter's input. A DC blocking capacitor can be included in a modulator output filter in a wide variety of locations, including, for example, at the input, at the output, or along the signal path between the input and the output.

Figure 4:
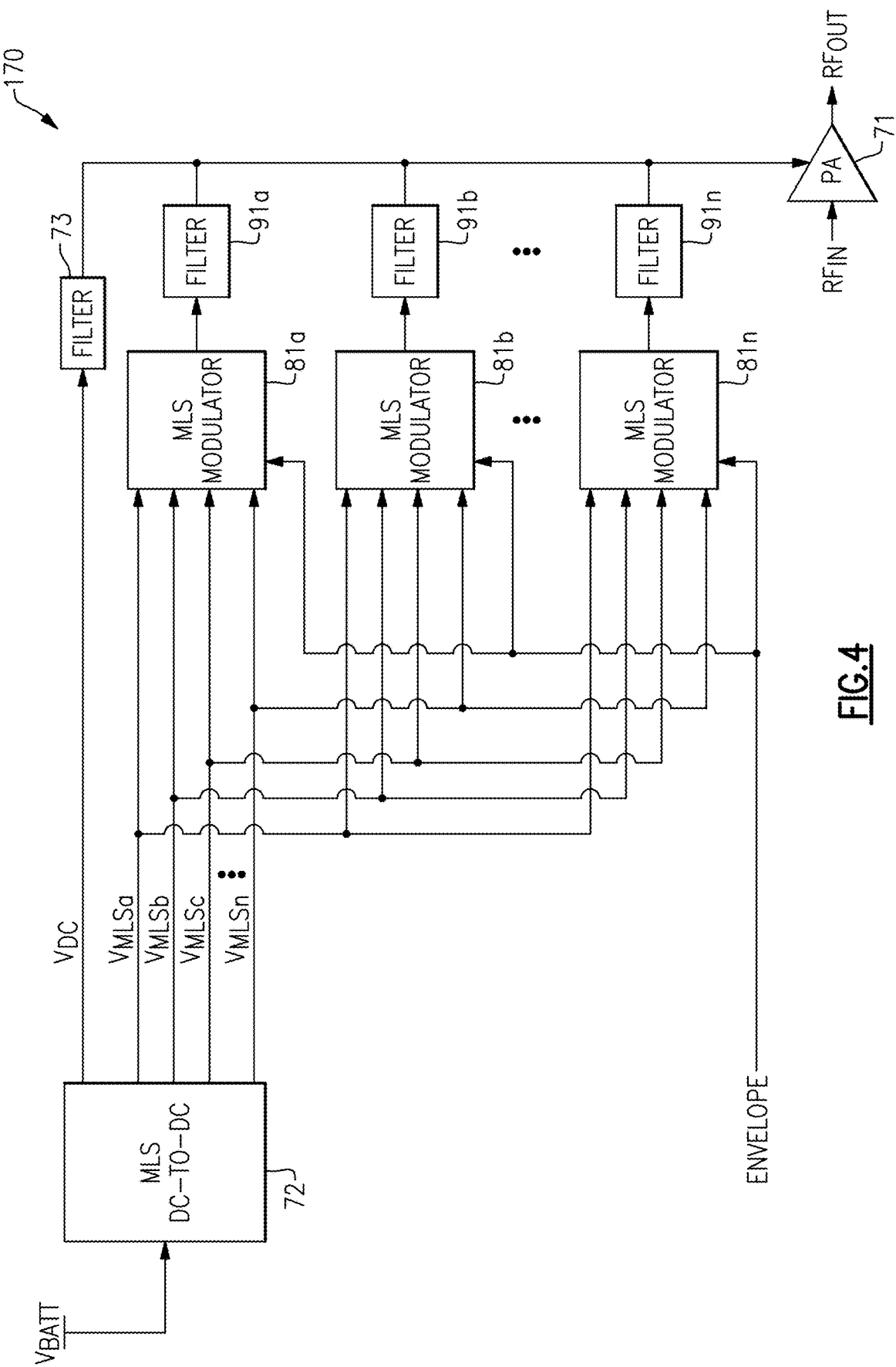
FIG. 4 is a schematic diagram of another embodiment of an envelope tracking system for a power amplifier.

FIG. 4 is a schematic diagram of another embodiment of an envelope tracking system 170 for a power amplifier. The envelope tracking system 170 includes an MLS DC-to-DC converter 72, a DC path filter 73, MLS modulators 81a, 81b, . . . 81n, modulator output filters 91a, 91b, . . . 91n.

The envelope tracking system 170 of FIG. 4 is similar to the envelope tracking system 100 of FIG. 2, except that the envelope tracking system 170 includes a plurality of modulators and a plurality of modulator output filters that operate in parallel with one another to generate the power amplifier supply voltage based on the analog envelope signal and the regulated voltages.

Including multiple modulators can provide a finer resolution of quantization. For example, any number (0, 1, 2, etc.) of the modulators can be activated at a given time to provide greater control over the power amplifier supply voltage.

Figure 5:
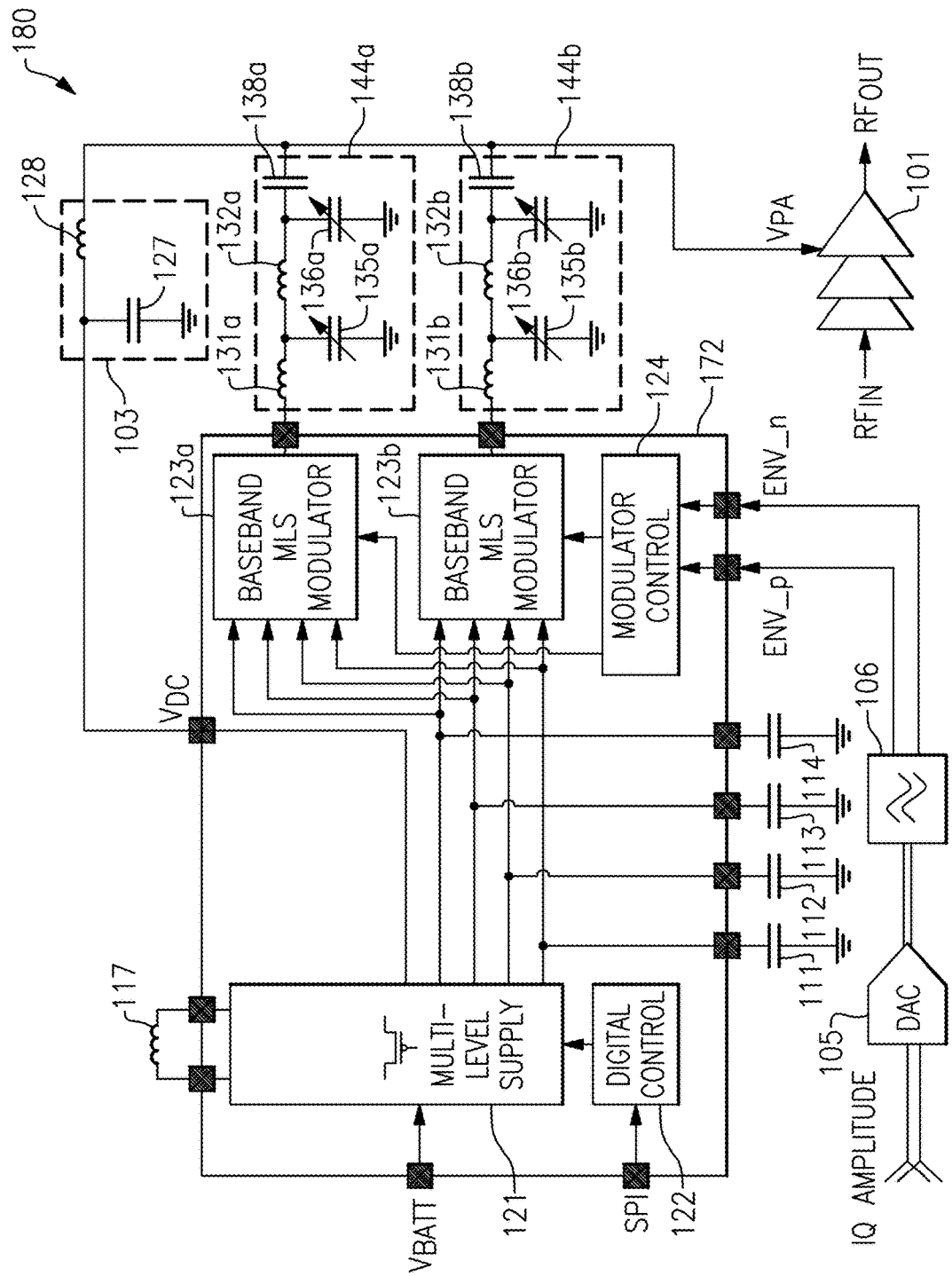
FIG. 5 is a schematic diagram of another embodiment of an envelope tracking system for a power amplifier.

FIG. 5 is a schematic diagram of another embodiment of an envelope tracking system 180 for a power amplifier. The envelope tracking system 180 of FIG. 5 includes an envelope tracking IC 172, a DC path filter 103, a first modulator output filter 144a, a second modulator output filter 144b, DAC circuitry 105, an envelope filter 106, first to fourth decoupling capacitors 111-114, respectively, and an inductor 117. The envelope tracking IC 172 includes MLS switching circuitry 121, a digital control circuit 122, a first baseband MLS modulator 123a, a second baseband MLS modulator 123b, and a modulator control circuit 124. Although an example with two baseband MLS modulators is shown, more or fewer baseband MLS modulators can be included.

The modulator control circuit 124 controls the MLS modulators 123a, 123b based on the differential analog envelope signal ENV_p, ENV_n. The modulator control circuit 124 can control whether or not either or both of the MLS modulators 123a, 123b are activated, as well as particular modulator switches that are opened or closed in each modulator. Including two or more MLS modulators can enhance quantization and provide greater control over generation of the power amplifier supply voltage $V_{PA}$.

In certain implementations, the modulator control circuit 124 includes a differential envelope amplifier for converting the differential analog envelope signal into a single-ended envelope signal, and two or more comparators that compare the single-ended analog envelope signal to different signal thresholds. Additionally, the modulator controller 124 controls the activation of the switches of the MLS modulators 123a, 123b based on the results of the comparisons.

Figure 6A:
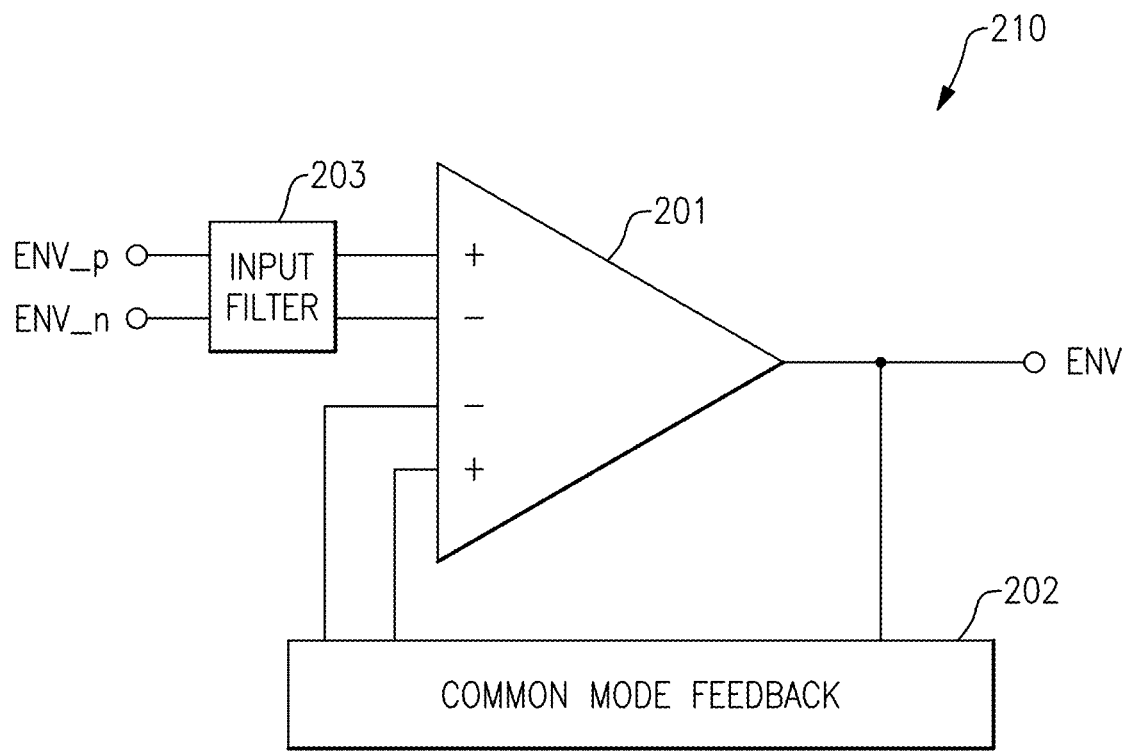
FIG. 6A is a schematic diagram of one embodiment of a differential envelope amplifier for an envelope tracking system.

FIG. 6A is a schematic diagram of one embodiment of a differential envelope amplifier 210 for an envelope tracking system. The differential envelope amplifier 210 includes an amplification circuit 201, a common mode feedback circuit 202, and a differential input filter 203.

The differential envelope amplifier 210 of FIG. 6A illustrates one embodiment of a differential envelope amplifier.

In certain implementations, a differential envelope amplifier is included in an envelope tracking interface to convert a differential envelope signal to a single-ended envelope signal and/or to provide compensation for common mode error. For example, a differential envelope tracker can be included in a modulator's control circuit. Although one example of a differential envelope amplifier is shown, a differential envelope amplifier can be implemented in a wide variety of ways.

The differential input filter 203 receives a differential analog envelope signal ENV_p, ENV_n, and filters the differential analog envelope signal to generate a filtered differential analog envelope signal.

The amplification circuit 201 includes a first differential input that receives the filtered differential analog envelope signal from the differential input filter 203 and a second differential input that receives a differential compensation signal from the common mode feedback circuit 202. The amplification circuit 201 includes an output that generates a single-ended analog envelope signal ENV.

As shown in FIG. 6A, the common mode feedback circuit 202 is connected between the output of the amplification circuit 201 and the second differential input of the amplification circuit 201. The common mode feedback circuit 202 provides single-ended to differential signal conversion, in this example.

The common mode feedback circuit 202 provides feedback that compensates the amplification circuit 201 for an error arising from a common mode voltage of the differential analog envelope signal ENV_p, ENV_n.

Figure 6B:
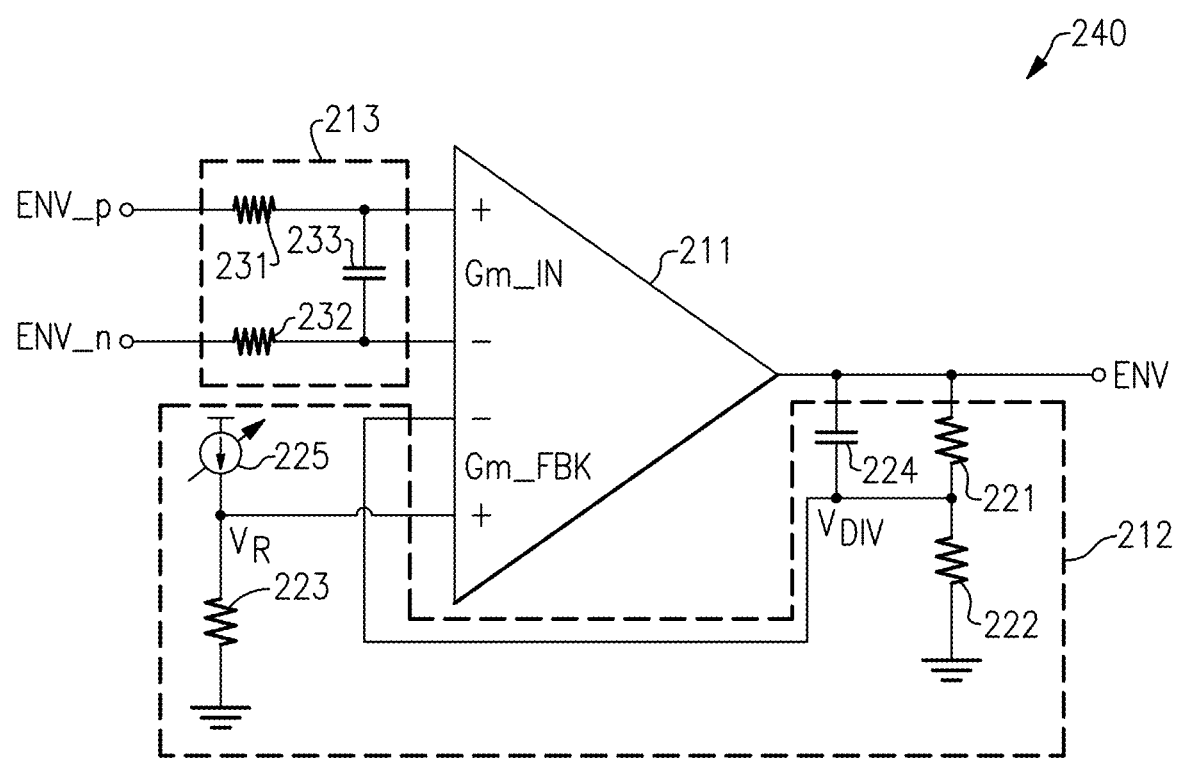
FIG. 6B is a schematic diagram of another embodiment of a differential envelope amplifier for an envelope tracking system.

FIG. 6B is a schematic diagram of one embodiment of a differential envelope amplifier 240 for an envelope tracking system. The differential envelope amplifier 240 includes an amplification circuit 211, a common mode feedback circuit 212, and a differential input filter 213.

The differential envelope amplifier 240 of FIG. 6B is similar to the differential envelope amplifier 210 of FIG. 6A, except that the differential envelope amplifier 240 includes specific implementations of circuitry. Although one example of circuitry is shown, a differential envelope amplifier can be implemented in other ways.

In the illustrated embodiment, the amplification circuit 211 includes a first differential input, a second differential input, and an output. The first differential input is a voltage input associated with a first transconductance Gm_IN, and the second differential input is a voltage input associated with a second transconductance Gm_FBK. In certain implementations, the amount of transconductance of Gm_IN is greater than that of Gm_FBK.

With continuing reference to FIG. 6B, the common mode feedback circuit 212 includes a first resistor 221 and a second resistor 222, which operate as a voltage divider that generates a divided voltage $V_{DIV}$. The first resistor 221 and the second resistor 222 are connected in series between the output of the amplification circuit 211 and a reference voltage, such as ground. The common mode feedback circuit 212 includes a capacitor 224 in parallel with the first resistor 221. The common mode feedback circuit 212 further includes a third resistor 223 and a current source 225 connected in series between a supply voltage and ground. The second differential input of the amplification circuit 221 compares a voltage $V_R$ across the third resistor 223 to the divided voltage $V_{DIV}$ generated by the first and second resistor 221, 222. In certain implementations the current source 225 is controllable (for instance, variable and/or programmable) to control a common mode setting of the common mode feedback circuit 212.

The common mode feedback circuit 212 operates to provide feedback that controls an output DC bias point or level of the amplification circuit 211, thereby reducing or eliminating an impact of a common mode voltage of the differential analog envelope signal ENV_P, ENV_n.

In the illustrated embodiment, the differential input filter 213 includes a first filter resistor 231, a second filter resistor 232, and a filter capacitor 233. The differential input filter 213 provides low pass filtering to the differential analog envelope signal ENV_p, ENV_n, and provides the filtered differential analog envelope signal to the first differential input of the amplification circuit 211.

Figure 7:
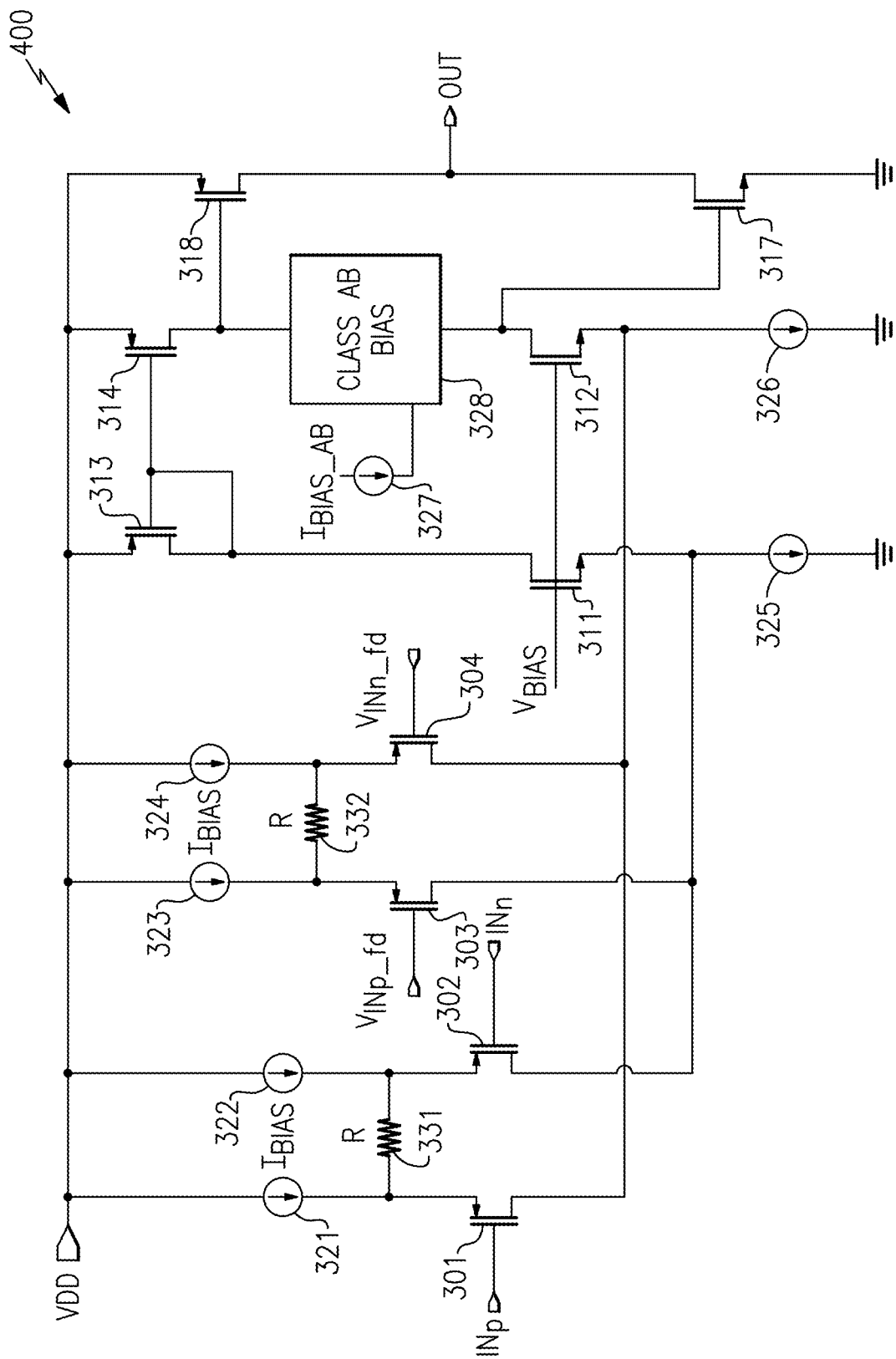
FIG. 7 is a schematic diagram of one embodiment of an amplification circuit for a differential envelope amplifier.

FIG. 7 is a schematic diagram of one embodiment of an amplification circuit 400 for the differential envelope amplifiers of FIGS. 6A and 6B. Although one example of a suitable amplification circuit is shown, a differential envelope amplifier can include amplification circuitry implemented in a wide variety of ways.

As shown in FIG. 7, the differential amplification circuit 400 includes a first pair of p-type field effect transistors (PFETs) 301-302 for amplifying a first differential input $IN_p$, $IN_n$. The first pair of PFETs 301-302 is biased by a first pair of current sources 321-322 (each providing a current $I_{BIAS}$, in this example), and includes a first resistor 331 of resistance R for coupling the source of the PFET 301 to the source of the PFET 302. The differential amplification circuit 400 further includes a second pair of PFETs 303-304 for amplifying a second differential input $V_{INp\_fd}$, $V_{INn\_fd}$, corresponding to a differential common mode compensation signal. The second pair of PFETs 303-304 is biased by a second pair of current sources 323-324 (also providing a current $I_{BIAS}$, in this example), and includes a second resistor 332 (also of resistance R, in this example) for coupling the source of the PFET 303 to the source of the PFET 304.

Currents from the first pair of PFETs 301-302 and the second pair of PFETs 303-304 are combined using folded cascode circuitry that includes current sources 325-326, cascode n-type field effect transistors (NFETs) 311-312, and load PFETs 313-314. In this example, the gates of the cascode NFETs 311-312 are controlled by a bias voltage $V_{BIAS}$.

The amplification circuit 400 further includes a push-pull output stage including output NFET 317, output PFET 318, a current source 327, and a class AB bias circuit 328. As shown in FIG. 7, the current source 327 provides a current $I_{BIAS\_AB}$ to the class AB bias circuit 328, which biases the output NFET 317 and output PFET 318 to provide enhanced bandwidth.

Figure 8:
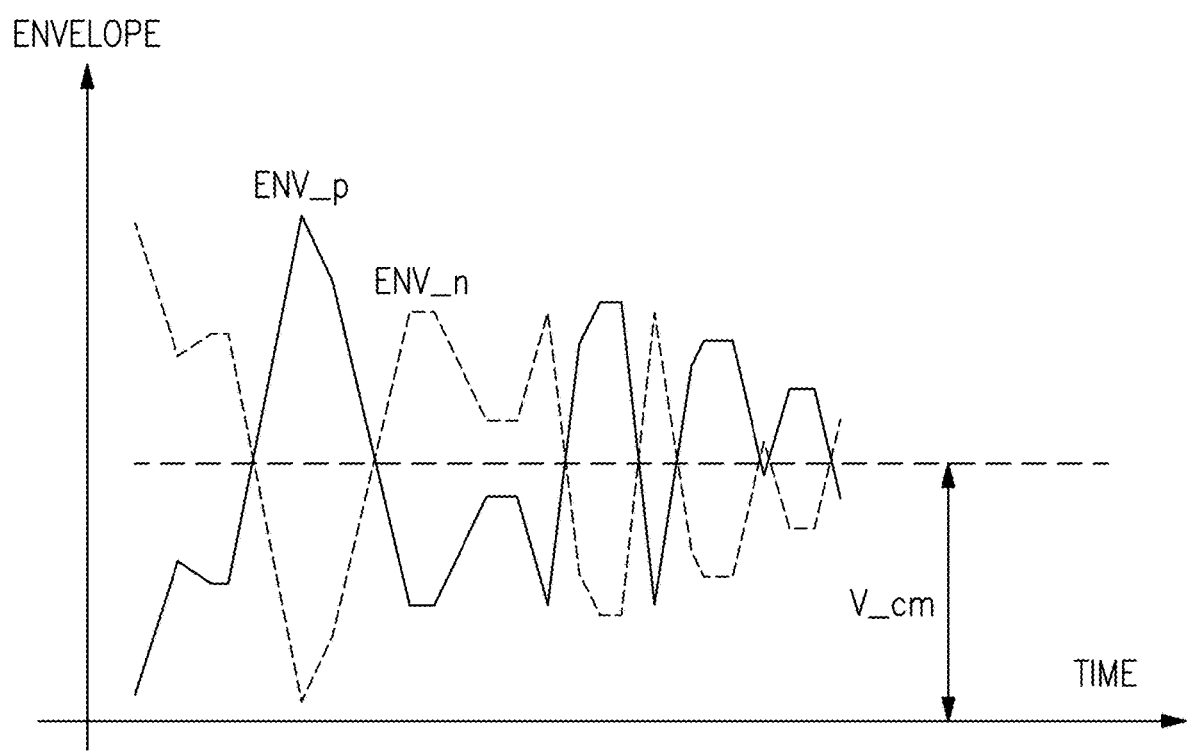
FIG. 8 is a graph of one example of differential analog envelope signal voltage versus time.

FIG. 8 is a graph of one example of differential analog envelope signal voltage versus time. As shown in FIG. 8, a non-inverted envelope signal ENV_p and an inverted envelope signal ENV_n operate as a differential analog envelope. By using differential signaling, common mode noise (V_cm) can be rejected.

In one example, the differential analog envelope signal corresponds to MIP eTrak envelope signal, such as a 1.2V differential envelope signal with 1.5V peak-to-peak maximum input swing or a 1.8V differential envelope signal with 2V peak-to-peak maximum input swing.

Figure 9:
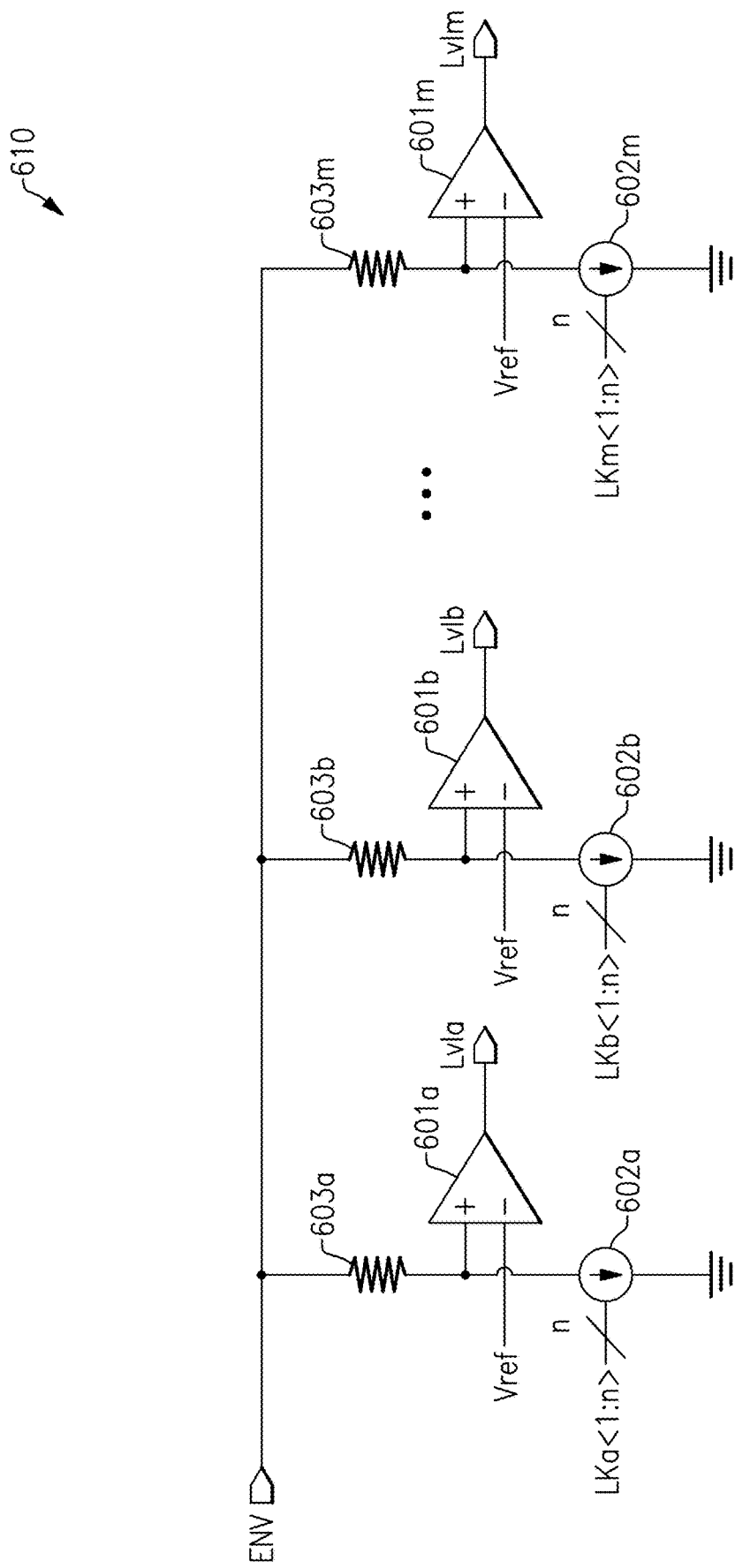
FIG. 9 is a schematic diagram of one embodiment of comparator circuitry for a multi-level supply (MLS) modulator.

FIG. 9 is a schematic diagram of one embodiment of comparator circuitry 610 for an MLS modulator. The comparator circuitry 610 includes comparators 601a, 601b, . . . 601m, resistors 603a, 603b, . . . 603m, and controllable current sources 602a, 602b, . . . 602m.

Although an example with three comparators and corresponding circuitry is shown, more or fewer comparators can be included as indicated by the ellipses. Furthermore, although one implementation of comparator circuitry for an MLS modulator is shown, other implementations of comparator circuitry can be used in accordance with the teachings herein.

The comparator circuitry 610 receives a single-ended analog envelope signal ENV (for instance, from a differential envelope amplifier, including, but not limited to, the differential envelope amplifier 210 of FIG. 6A or the differential envelope amplifier 240 of FIG. 6B), and generates comparator output signals Lvla, Lvlb, . . . Lvlm.

The comparator output signals Lvla, Lvlb, . . . Lvlm are generated based on comparing the single-ended envelope signal ENV to different signal thresholds. For example, although the comparators 601a, 601b, . . . 601m each receive a common reference voltage Vref, separate thresholds are controlled for the comparators 601a, 601b, . . . 601m by the controllable current sources 602a, 602b, . . . 602m, respectively. For example, the magnitudes of the currents from the controllable current sources 602a, 602b, . . . 602m controls a voltage drop across the resistors 603a, 603b, . . . 603m, respectively, and a corresponding signal threshold used for comparison.

In the illustrated embodiment, n-bit digital control signals LKa<1:n>, LKb<1:n>, . . . , LKm<1:n> are used to control the levels of the signal thresholds of the comparators 601a, 601b, . . . 601m, respectively. In certain implementations, the digital control signals are controlled based on data received over an interface, for instance, an SPI bus. Although one example of signal threshold control is shown, the teachings herein are applicable to signal threshold control implemented in other ways.

In certain implementations, the comparator output signals Lvla, Lvlb, . . . Lvlm are used to control selective activation of individual switches of a modulator and/or a number of active modulators in multi-modulator implementations.

Figure 10:
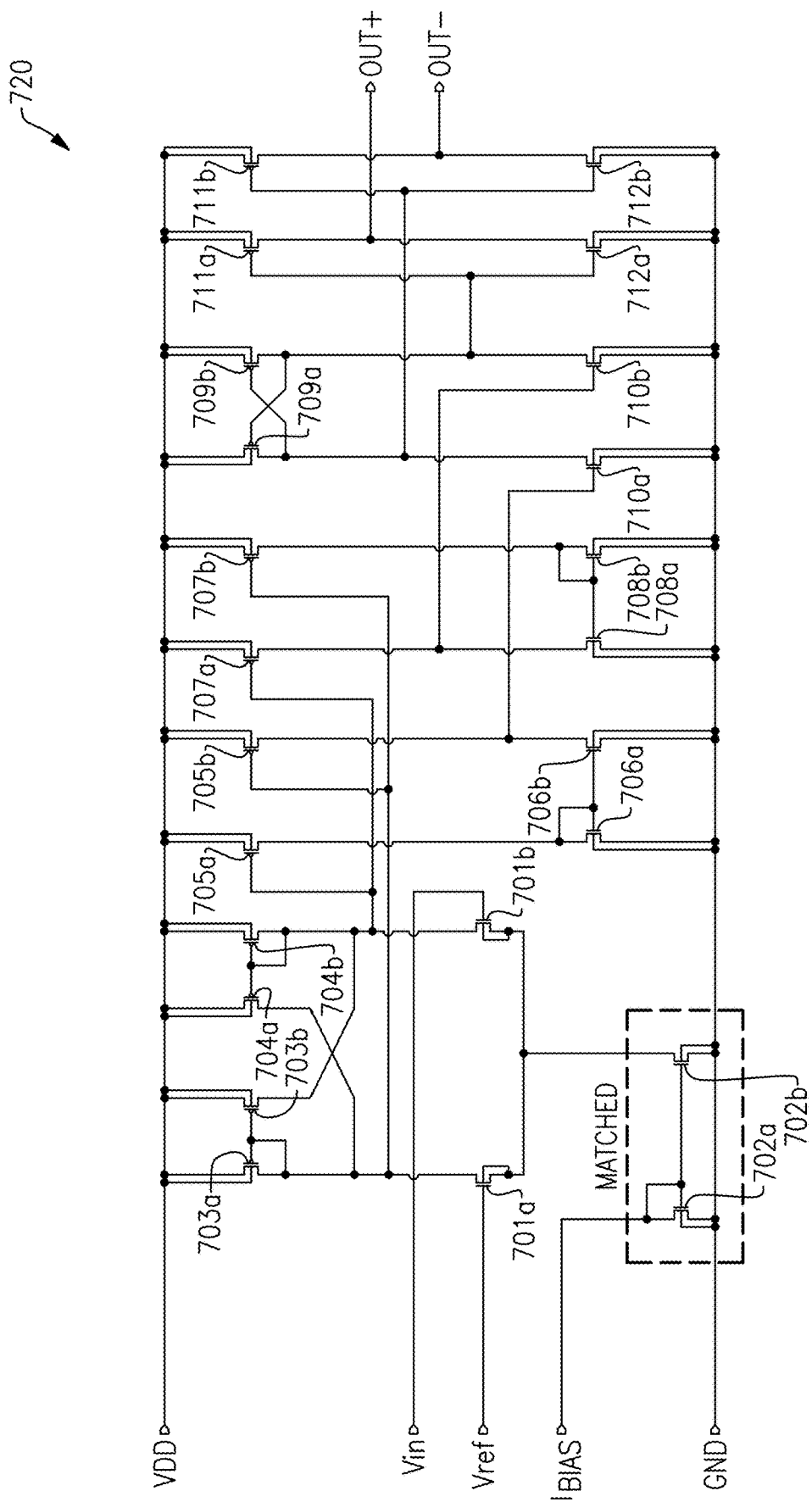
FIG. 10 is a schematic diagram of embodiment of a comparator for the comparator circuitry of FIG. 9.

FIG. 10 is a schematic diagram of embodiment of a comparator 720 for the comparator circuitry 610 of FIG. 9. Although one example of a suitable comparator is shown, an MLS modulator can include comparators implemented in a wide variety of ways.

The comparator 720 includes a pair of input NFETs 701a-701b, a pair of bias NFETs 702a-702b, a first pair of load PFETs 703a-703b, a second pair of load PFETs 704a-704b, a first pair of current source PFETs 705a-705b, a first pair of mirror NFETs 706a-706b, a second pair of current source PFETs 707a-707b, a second pair of mirror NFETs 708a-708b, a pair of current source NFETs 710a-710b, a third pair of load PFETs 709a-709b, a pair of output PFETs 711a-711b, and a pair of output NFETs 712a-712b. In certain implementations, the bias NFET 702b is scaled in size (for instance, of larger device width) than the bias NFET 702a, but implemented with a matched transistor layout.

In the illustrated embodiment, the comparator 720 receives an input voltage Vin and a reference voltage Vref, and outputs a differential comparison signal OUT+, OUT− indicating a result of the comparison. The comparator 720 is biased by a current $I_{BIAS}$, and receives a power supply voltage VDD and ground voltage GND. Although the comparison signal is implemented differentially in this example, either of the signal components of the differential comparison signal OUT+, OUT− can be used as a single-ended comparison signal.

Figure 11:
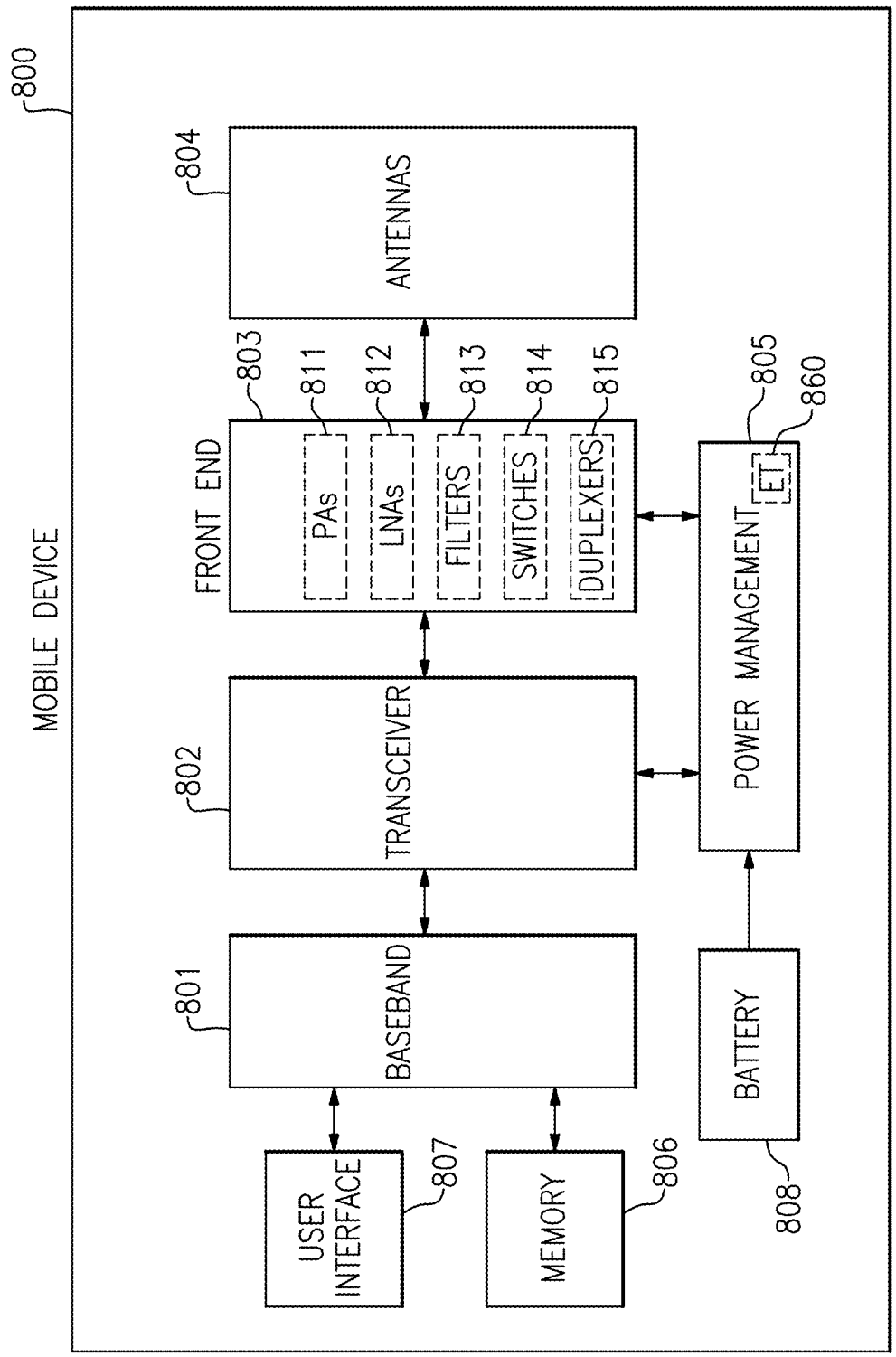
FIG. 11 is a schematic diagram of a mobile device according to another embodiment.

FIG. 11 is a schematic diagram of a mobile device 800 according to another embodiment. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an MLS envelope tracker 860 implemented in accordance with one or more features of the present disclosure.

As shown in FIG. 11, the power management system 805 receives a battery voltage form the battery 808. The battery 808 can be any suitable battery for use in the mobile device 800, including, for example, a lithium-ion battery.

Figure 12:
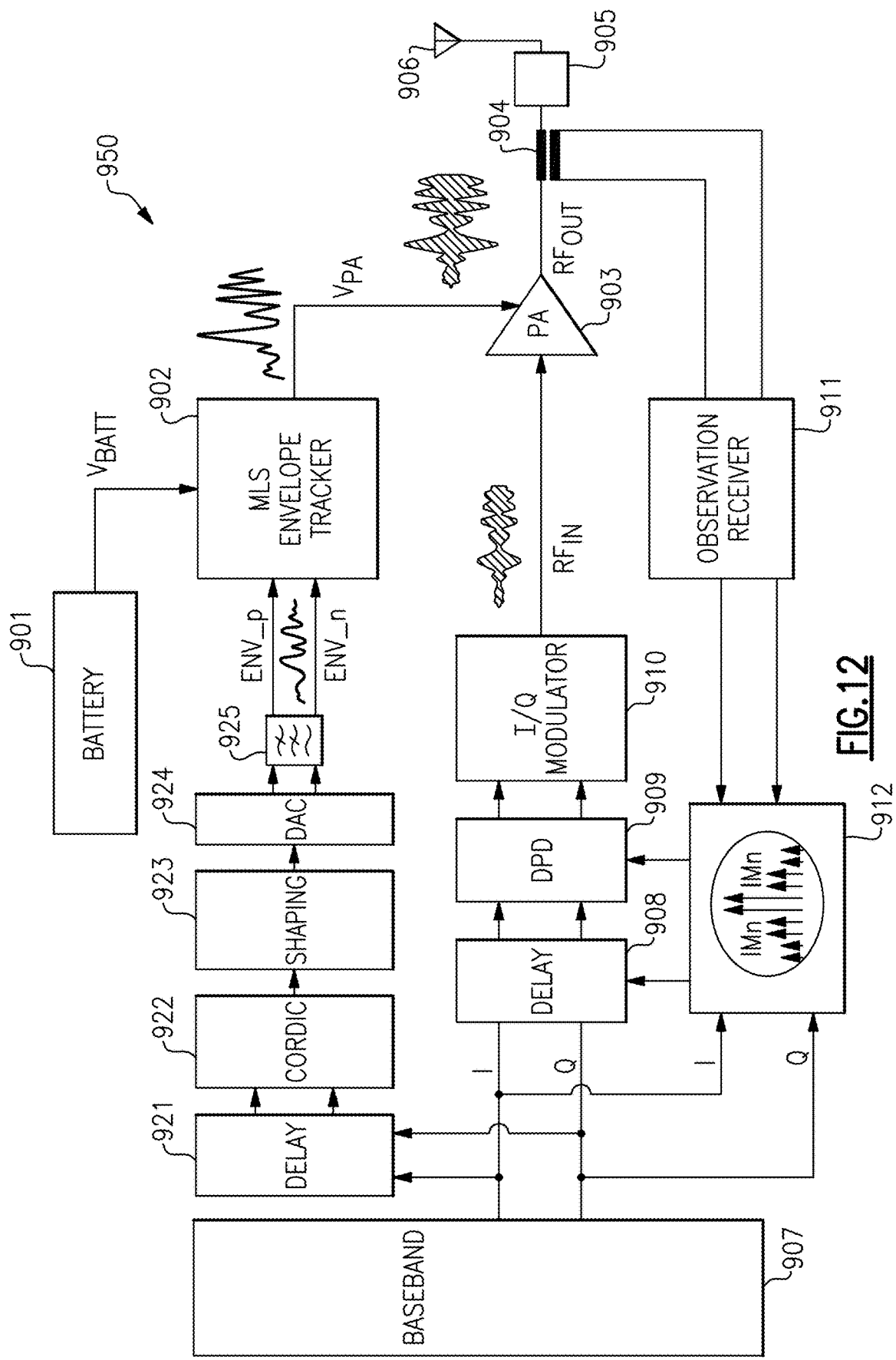
FIG. 12 is a schematic diagram of one embodiment of a communication system for transmitting radio frequency (RF) signals.

FIG. 12 is a schematic diagram of one embodiment of a communication system 950 for transmitting RF signals. The communication system 950 includes a battery 901, an MLS envelope tracker 902, a power amplifier 903, a directional coupler 904, a duplexing and switching circuit 905, an antenna 906, a baseband processor 907, a signal delay circuit 908, a digital pre-distortion (DPD) circuit 909, an I/Q modulator 910, an observation receiver 911, an intermodulation detection circuit 912, an envelope delay circuit 921, a coordinate rotation digital computation (CORDIC) circuit 922, a shaping circuit 923, a digital-to-analog converter 924, and a reconstruction filter 925.

The communication system 950 of FIG. 12 illustrates one example of an RF system that can include an envelope tracking system implemented in accordance with one or more features of the present disclosure. However, the teachings herein are applicable to RF systems implemented in a wide variety of ways.

The baseband processor 907 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 907 can be any suitable processor for processing baseband signals. For instance, the baseband processor 907 can include a digital signal processor, a microprocessor, a programmable core, or any combination thereof.

The signal delay circuit 908 provides adjustable delay to the I and Q signals to aid in controlling relative alignment between the differential analog envelope signal ENV_p, ENV_n provided to the MLS envelope tracker 902 and the RF signal $RF_{IN}$ provided to the power amplifier 903. The amount of delay provided by the signal delay circuit 908 is controlled based on amount of intermodulation in adjacent bands detected by the intermodulation detection circuit 912.

The DPD circuit 909 operates to provide digital shaping to the delayed I and Q signals from the signal delay circuit 908 to generate digitally pre-distorted I and Q signals. In the illustrated embodiment, the DPD provided by the DPD circuit 909 is controlled based on amount of intermodulation detected by the intermodulation detection circuit 912. The DPD circuit 909 serves to reduce a distortion of the power amplifier 903 and/or to increase the efficiency of the power amplifier 903.

The I/Q modulator 910 receives the digitally pre-distorted I and Q signals, which are processed to generate the RF signal $RF_{IN}$. For example, the I/Q modulator 910 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 910 can include one or more filters configured to filter frequency content of signals processed therein.

The envelope delay circuit 921 delays the I and Q signals from the baseband processor 907. Additionally, the CORDIC circuit 922 processes the delayed I and Q signals to generate a digital envelope signal representing an envelope of the RF signal $RF_{IN}$. Although FIG. 12 illustrates an implementation using the CORDIC circuit 922, an analog envelope signal can be obtained in other ways.

The shaping circuit 923 operates to shape the digital envelope signal to enhance the performance of the communication system 950. In certain implementations, the shaping circuit 923 includes a shaping table that maps each level of the digital envelope signal to a corresponding shaped envelope signal level. Envelope shaping can aid in controlling linearity, distortion, and/or efficiency of the power amplifier 903.

In the illustrated embodiment, the shaped envelope signal is a digital signal that is converted by the DAC 924 to a differential analog envelope signal. Additionally, the differential analog envelope signal is filtered by the reconstruction filter 925 to generate a differential analog envelope signal ENV_p, ENV_n suitable for use by a differential envelope amplifier of the MLS envelope tracker 902. In certain implementations, the reconstruction filter 925 includes a differential low pass filter.

With continuing reference to FIG. 12, the MLS envelope tracker 902 receives the differential analog envelope signal from the reconstruction filter 925 and a battery voltage $V_{BATT}$ from the battery 901, and uses the differential analog envelope signal ENV_p, ENV_n to generate a power amplifier supply voltage $V_{CC\_PA}$ for the power amplifier 903 that changes in relation to the envelope of the RF signal $RF_{IN}$. The power amplifier 903 receives the RF signal $RF_{IN}$ from the I/Q modulator 910, and provides an amplified RF signal $RF_{OUT}$ to the antenna 906 through the duplexing and switching circuit 905, in this example.

The directional coupler 904 is positioned between the output of the power amplifier 903 and the input of the duplexing and switching circuit 905, thereby allowing a measurement of output power of the power amplifier 903 that does not include insertion loss of the duplexing and switching circuit 905. The sensed output signal from the directional coupler 904 is provided to the observation receiver 911, which can include mixers for providing down conversion to generate downconverted I and Q signals, and DACs for generating I and Q observation signals from the downconverted I and Q signals.

The intermodulation detection circuit 912 determines an intermodulation product between the I and Q observation signals and the I and Q signals from the baseband processor 907. Additionally, the intermodulation detection circuit 912 controls the DPD provided by the DPD circuit 909 and/or a delay of the signal delay circuit 908 to control relative alignment between the differential analog envelope signal ENV_p, ENV_n and the RF signal $RF_{IN}$. In another embodiment, the intermodulation detection circuit 912 additionally or alternatively controls a delay of the signal delay circuit 921.

By including a feedback path from the output of the power amplifier 903 and baseband, the I and Q signals can be dynamically adjusted to optimize the operation of the communication system 950. For example, configuring the communication system 950 in this manner can aid in providing power control, compensating for transmitter impairments, and/or in performing DPD.

Although illustrated as a single stage, the power amplifier 903 can include one or more stages. Furthermore, the teachings herein are applicable to communication systems including multiple power amplifiers.

Figure 13:
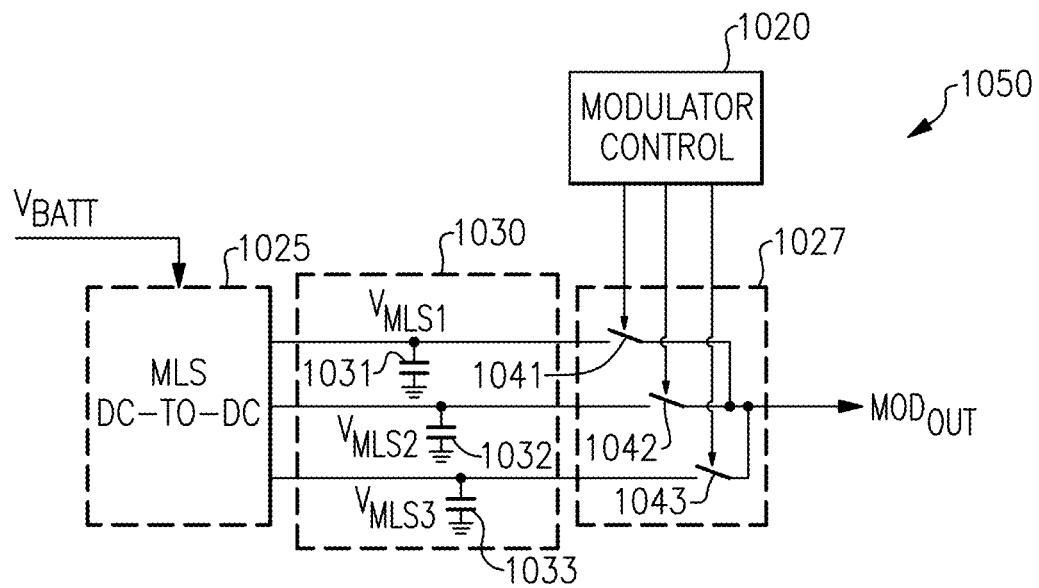
FIG. 13 is a schematic diagram of an MLS modulation system according to one embodiment.

FIG. 13 is a schematic diagram of an MLS modulation system according to one embodiment. The MLS modulation system 1050 includes a modulator control circuit 1020, an MLS DC-to-DC converter 1025, a modulator switch bank 1027, and a decoupling capacitor bank 1030.

The MLS modulation system 1050 of FIG. 13 illustrates one implementation of MLS modulator circuitry suitable for incorporation in a multi-level envelope tracker. However, other implementations of MLS modulator circuitry can be included in multi-level envelope trackers implemented in accordance with the teachings herein.

The MLS DC-to-DC converter 1025 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the MLS DC-to-DC converter 1025 can generate more or fewer regulated voltages. In certain implementations, at least a portion of the regulated voltages are boosted relative to the battery voltage $V_{BATT}$. Additionally or alternatively, one or more of the regulated voltages is a buck voltage having a voltage lower than the battery voltage $V_{BATT}$.

The decoupling capacitor bank 1030 aids in stabilizing the regulated voltages generated by the MLS DC-to-DC converter 1025. For example, the decoupling capacitor bank 1030 of FIG. 13 includes a first decoupling capacitor 1031 for decoupling the first regulated voltage $V_{MLS1}$, a second decoupling capacitor 1032 for decoupling the second regulated voltage $V_{MLS2}$, and a third decoupling capacitor 1033 for decoupling the third regulated voltage $V_{MLS3}$.

With continuing reference to FIG. 13, the modulator switch bank 1027 includes a first switch 1041 connected between the modulator's output ($MOD_{OUT}$) and the first regulated voltage $V_{MLS1}$, a second switch 1042 connected between the modulator's output and the second regulated voltage $V_{MLS2}$, and a third switch 1043 connected between the modulator's output and the third regulated voltage $V_{MLS3}$. The modulator control 1020 operates to selectively open or close the switches 1041-1043 to thereby control modulator's output.

Figure 14:
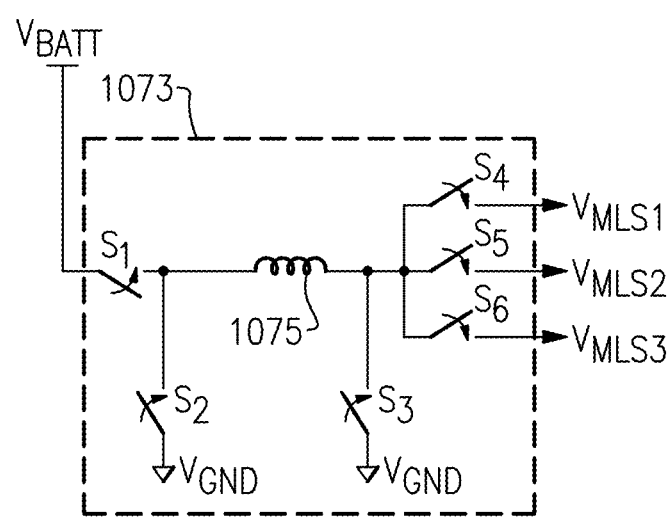
FIG. 14 is a schematic diagram of an MLS DC-to-DC converter according to one embodiment.

FIG. 14 is a schematic diagram of an MLS DC-to-DC converter 1073 according to one embodiment. The MLS DC-to-DC converter 1073 includes an inductor 1075, a first switch $S_1$, a second switch $S_2$, a third switch $S_3$, a fourth switch $S_4$, a fifth switch $S_5$, and a sixth switch $S_6$. The MLS DC-to-DC converter 1073 further includes control circuitry (not shown in FIG. 14) for opening and closing the switches to provide regulation.

The MLS DC-to-DC converter 1073 of FIG. 14 illustrates one implementation of an MLS DC-to-DC converter suitable for incorporation in a multi-level envelope tracker. However, other implementations of MLS DC-to-DC converters can be included in multi-level envelope trackers implemented in accordance with the teachings herein.

In the illustrated embodiment, the first switch $S_1$ includes a first end electrically connected to the battery voltage $V_{BATT}$ and a second end electrically connected to a first end of the second switch $S_2$ and to a first end of the inductor 1075. The second switch $S_2$ further includes a second end electrically connected to a first or ground supply $V_{GND}$. Although FIG. 14 illustrates a configuration of a DC-to-DC converter that is powered using a ground supply and a battery voltage, the teachings herein are applicable to DC-to-DC converters powered using any suitable power supplies. The inductor 1075 further includes a second end electrically connected to a first end of each of the third to sixth switches $S_3$-$S_6$. The third switch $S_3$ further includes a second end electrically connected to the ground supply $V_{GND}$. The fourth, fifth, and sixth switches $S_4$-$S_6$ each include a second end configured to generate the first, second, and third regulated voltages $V_{MLS1}$, $V_{MLS2}$, and $V_{MLS3}$, respectively.

The first to sixth switches $S_1$-$S_6$ are selectively opened or closed to maintain regulated voltages within a particular error tolerance of target voltage levels. Although an example with three regulated voltages is shown, the MLS DC-to-DC converter 1073 can be implemented to generate more or fewer regulated voltages.

In the illustrated embodiment, the MLS DC-to-DC converter 1073 operates as a buck-boost converter operable to generate regulated boost voltages greater than the battery voltage $V_{BATT}$ and/or regulated buck voltages lower than the battery voltage $V_{BATT}$. However, other implementations are possible.

Figure 15:
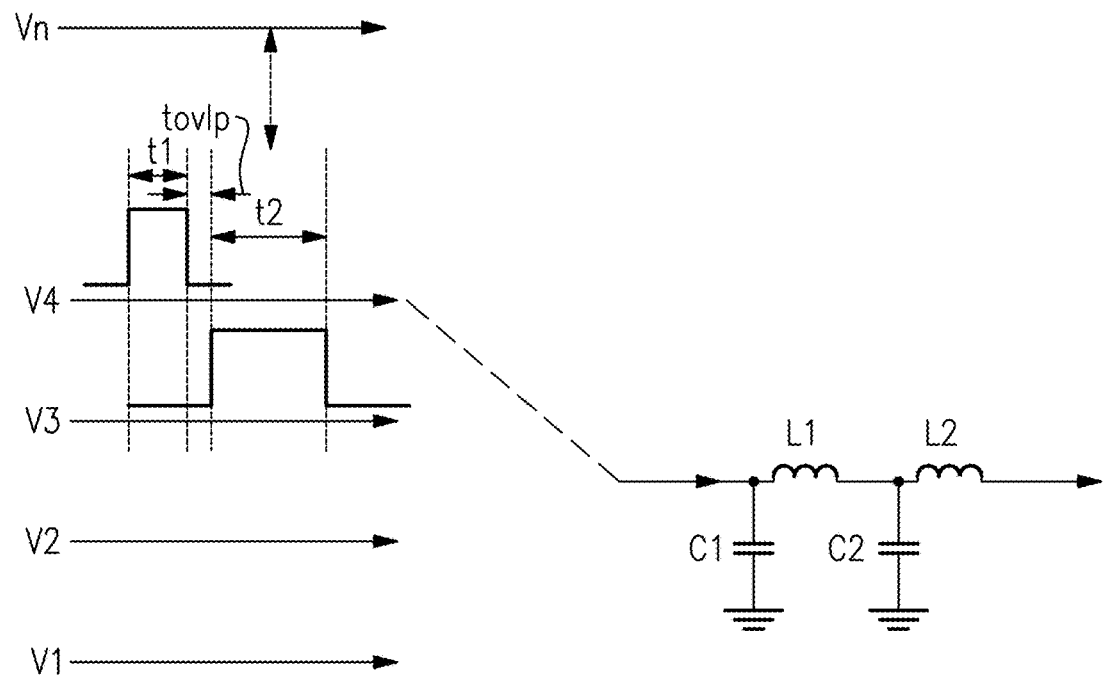
FIG. 15 is a schematic diagram of one example of timing for MLS DC-to-DC conversion.

FIG. 15 is a schematic diagram of one example of timing for MLS DC-to-DC conversion. As shown in FIG. 15, the width of regulation cycles can be used to control the voltage level of the regulated voltages generated by MLS DC-to-DC conversion. For instance, one MLS regulated voltage can be associated with a period t1, while a second regulation voltage can be associated with a different period t2. Additionally, a non-overlap period tovlp can be used to avoid crowbar currents between different voltage levels.

In certain implementations herein, one or more regulation periods (for instance, t1 and/or t2) and/or one or more non-overlap period (for instance, tovlop) are digitally controllable. In certain implementations, the delays are controlled based on a digital state machine and/or other suitable circuitry.

The regulated voltages generated by MLS DC-to-DC conversion can be selectively provided by a modulator to a modulator output filter. In the illustrated example, the modulator output filter is depicted as including shunt capacitors C1 and C2 and series inductors L1 and L2. However, other implementations of modulator output filters are possible.

Figure 16:
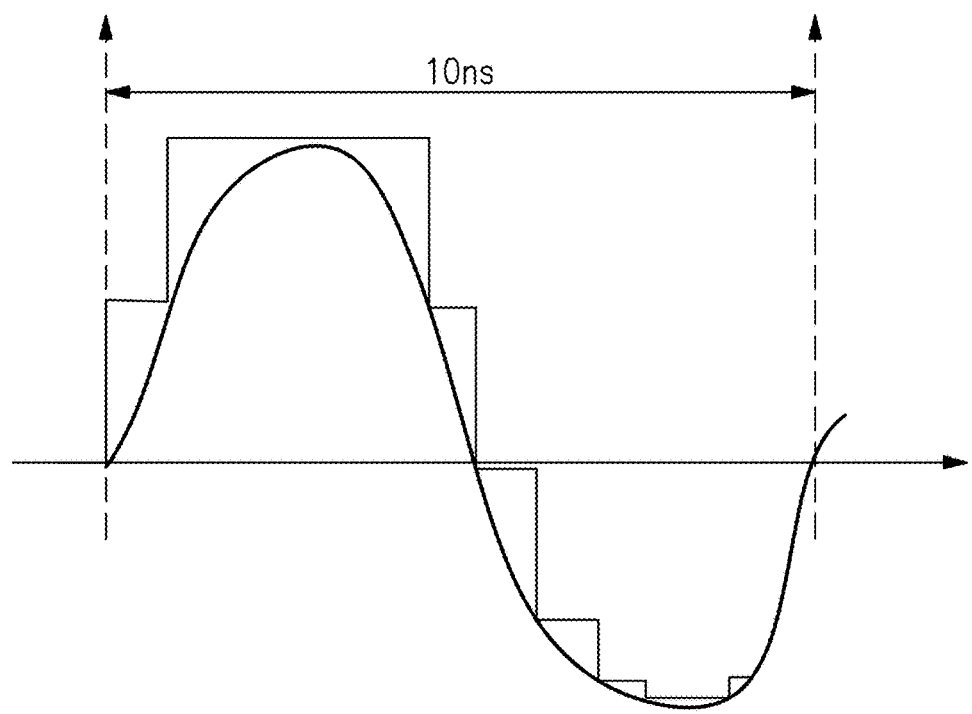
FIG. 16 is a schematic diagram of one example of MLS envelope tracking for a continuous wave signal.

FIG. 16 is a schematic diagram of one example of MLS envelope tracking for a continuous wave signal. The example shown is for a continuous wave signal having a frequency of about 100 MHz and a corresponding period of about 10 ns. Examples of suitable MLS voltage levels for the signal are shown.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system comprising:
a power amplifier configured to amplify a radio frequency signal and to receive power from a power amplifier supply voltage; and
an envelope tracker configured to generate the power amplifier supply voltage at an envelope tracker output based on an analog envelope signal corresponding to an envelope of the radio frequency signal, the envelope tracker including a plurality of modulators each receiving a plurality of regulated voltages, a plurality of modulator output filters each coupled between the envelope tracker output and a corresponding one of the plurality of modulators, and a modulator control circuit configured to control the plurality of modulators based on the analog envelope signal.

2. The envelope tracking system of claim 1 wherein the envelope tracker further includes a DC-to-DC converter configured to generate the plurality of regulated voltages.

3. The envelope tracking system of claim 1 wherein each of the plurality of modulators includes a plurality of switches each receiving a corresponding one of the plurality of regulated voltages.

4. The envelope tracking system of claim 1 wherein the modulator control circuit is configured to select an active number of the plurality of modulators based on comparing the analog envelope signal to a plurality of signal thresholds.

5. The envelope tracking system of claim 4 wherein each of the plurality of signal thresholds is controllable.

6. The envelope tracking system of claim 1 wherein the envelope tracker is configured to receive the analog envelope signal over a Mobile Industry Peripheral Interface Analog Reference Interface for Envelope Tracking.

7. The envelope tracking system of claim 1 wherein the analog envelope signal is a differential envelope signal.

8. The envelope tracking system of claim 1 wherein each of the plurality of modulator output filters includes at least one series inductor and at least one shunt capacitor.

9. The envelope tracking system of claim 1 wherein the envelope tracker further includes a DC path filter coupled between a DC voltage and the power amplifier supply voltage.

10. The envelope tracking system of claim 9 wherein the envelope tracker further includes further includes a DC-to-DC converter configured to generate the plurality of regulated voltages and the DC voltage.

11. A mobile device comprising:
a transceiver configured to generate a radio frequency signal for transmission;
a front end circuit including a power amplifier configured to amplify the radio frequency signal and to receive power from a power amplifier supply voltage; and
a power management circuit including an envelope tracker configured to generate the power amplifier supply voltage at an envelope tracker output based on an analog envelope signal corresponding to an envelope of the radio frequency signal, the envelope tracker including a plurality of modulators each receiving a plurality of regulated voltages, a plurality of modulator output filters each coupled between the envelope tracker output and a corresponding one of the plurality of modulators, and a modulator control circuit configured to control the plurality of modulators based on the analog envelope signal.

12. The mobile device of claim 11 wherein the envelope tracker further includes a DC-to-DC converter configured to generate the plurality of regulated voltages.

13. The mobile device of claim 11 wherein each of the plurality of modulators includes a plurality of switches each receiving a corresponding one of the plurality of regulated voltages.

14. The mobile device of claim 11 wherein the modulator control circuit is configured to select an active number of the plurality of modulators based on comparing the analog envelope signal to a plurality of signal thresholds.

15. The mobile device of claim 11 wherein the analog envelope signal is a differential envelope signal.

16. The mobile device of claim 11 wherein each of the plurality of modulator output filters includes at least one series inductor and at least one shunt capacitor.

17. The mobile device of claim 11 wherein the envelope tracker further includes a DC path filter coupled between a DC voltage and the power amplifier supply voltage.

18. The mobile device of claim 17 wherein the envelope tracker further includes further includes a DC-to-DC converter configured to generate the plurality of regulated voltages and the DC voltage.

19. A method of envelope tracking in a mobile device, the method comprising:
powering a power amplifier using a power amplifier supply voltage;
amplifying a radio frequency signal using the power amplifier; and
generating the power amplifier supply voltage at an envelope tracker output based on an analog envelope signal corresponding to an envelope of the radio frequency signal, wherein generating the power amplifier supply voltage includes providing a plurality of regulated voltages to each of a plurality of modulators, controlling the plurality of modulators based on the analog envelope signal using a modulator control circuit, and providing filtering using a plurality of modulator output filters each coupled between the envelope tracker output and a corresponding one of the plurality of modulators.

20. The method of claim 19 further comprising generating the plurality of regulated voltages using a DC-to-DC converter.

* * * * *